United States Patent
Ueda et al.

(10) Patent No.: US 6,300,242 B1
(45) Date of Patent: Oct. 9, 2001

(54) SEMICONDUCTOR DEVICE AND METHOD OF FABRICATING THE SAME

(75) Inventors: Tetsuya Ueda, Osaka; Eiji Tamaoka; Nobou Aoi, both of Hyogo; Hideo Nakagawa, Kyoto, all of (JP)

(73) Assignee: Matsuhita Electronics Corporation, Osaka (JP)

( * ) Notice: Subject to any disclaimer, the term of this patent is extended or adjusted under 35 U.S.C. 154(b) by 0 days.

(21) Appl. No.: 09/560,299

(22) Filed: Apr. 27, 2000

(30) Foreign Application Priority Data

Apr. 28, 1999 (JP) .................................................. 11-121230

(51) Int. Cl.[7] .............................................. H01L 21/4763
(52) U.S. Cl. .............................................. 438/638; 438/672
(58) Field of Search ..................................... 438/622, 624, 438/637, 638, 641, 672, 675, 687

(56) References Cited

U.S. PATENT DOCUMENTS 5,445,710 * 8/1995 Hori et al. ........................ 156/643.1

* cited by examiner

*Primary Examiner*—David Nelms
*Assistant Examiner*—Phuc T. Dang
(74) *Attorney, Agent, or Firm*—Eric J. Robinson; Nixon Peabody LLP

(57) ABSTRACT

After a first metal film and a first interlayer insulating film are deposited successively on an insulating film on a semiconductor substrate, a via hole is formed in the first interlayer insulating film. A second metal film is grown in the via hole to form a via contact composed of the second metal film, while a recessed portion is formed over the via contact in the via hole. A cap layer composed of a material different from the material of the first metal film is formed in the recessed portion. Then, the first metal film is patterned by using a mask pattern for forming a lower interconnect and a cap layer as a mask, whereby a lower interconnect is formed.

27 Claims, 16 Drawing Sheets

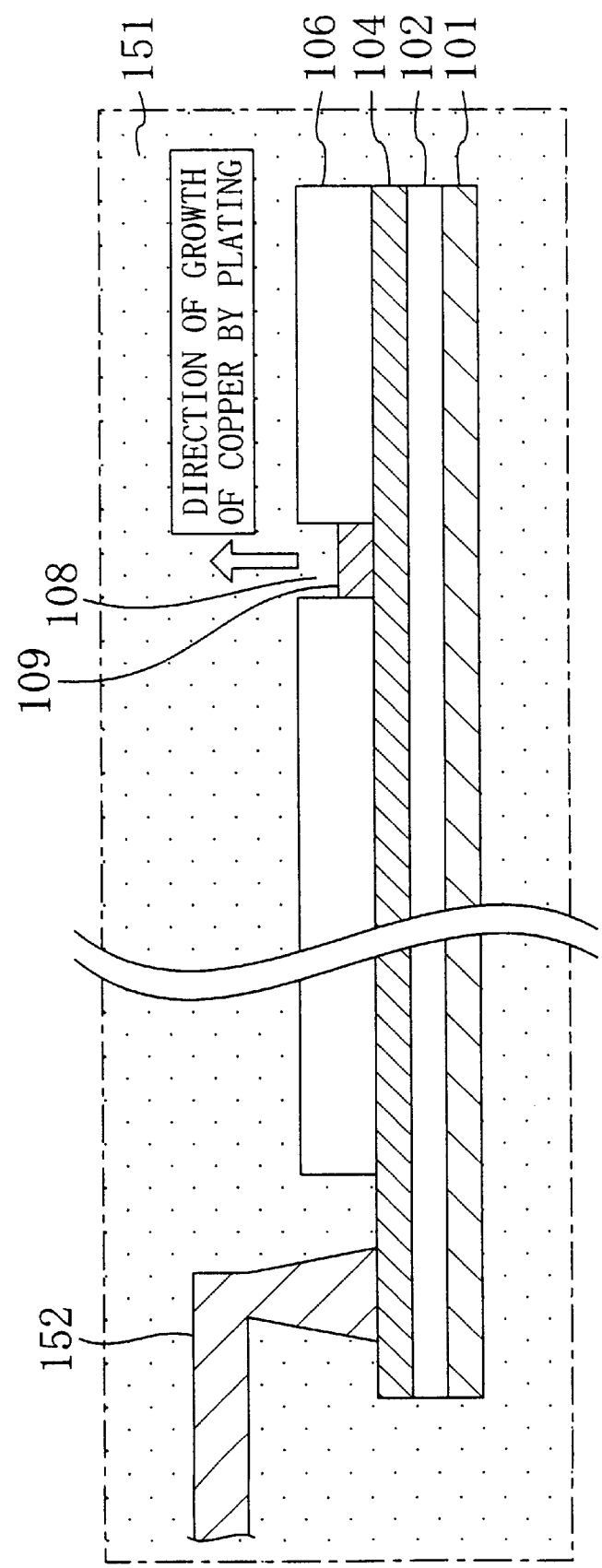

SEMICONDUCTOR DEVICE AND METHOD OF FABRICATING THE SAME

BACKGROUND OF THE INVENTION

The present invention relates to a semiconductor device having multilayer wiring or interconnects and to a method of fabricating the same.

To provide a semiconductor LSI device operable at a higher speed with improved reliability, there has been developed a technique for forming an interconnect using copper (Cu) having lower resistance than aluminum (Al) that has been used conventionally for interconnect formation.

To miniaturize the semiconductor LSI device, the number of layers contained in a multilayer wiring or interconnect structure has been increased gradually.

Referring now to FIG. 16 showing a cross-sectional structure of a conventional semiconductor device, a description will be given to a method of forming, by using a dual damascene method (Dual Damascene: A ULSI WIRING TECHNOLOGY, C. W. Kannta et. al. Jun. 11–12 1991, VMIC Conference), an upper interconnect to be connected to a lower interconnect through a via contact above a semiconductor substrate formed with the lower interconnect.

First, a first interconnect groove 3 is formed in a first interlayer insulating film 2 on a semiconductor substrate 1. Then, a lower interconnect 7 composed of a first adhesion layer 4, a first seed layer 5, and a first copper plating layer 6 is formed in the first interconnect groove 3.

Next, a second interlayer insulating film 8 is deposited, masked with a mask pattern (not shown) formed on the second interlayer insulating film 8, and subjected to dry etching for successively forming a via hole 9 and a second interconnect groove 10 in the second interlayer insulating film 8. Thereafter, a second adhesion layer 11 and a second seed layer 12 composed of a copper film are deposited successively on the second interlayer insulating film 8 including the inner surfaces of the via hole 9 and the second interconnect groove 10.

Next, a second copper plating layer 13 is deposited on the second seed layer 12 by electroplating using the second seed layer 12 as a cathode for plating. Then, the portions of the second adhesion layer 11, the second seed layer 12, and the second copper plating layer 13 exposed on the second interlayer insulating film 8 are removed such that a via contact 14 and an upper interconnect 15 each composed of the second adhesion layer 11, the second seed layer 12, and the second copper plating layer 13 are formed.

With the increasing miniaturization of the semiconductor LSI device, however, the following problems are encountered by the conventional method of forming multilayer wiring or interconnects.

(1) Since the mask pattern for forming the via hole is inevitably displaced from the lower interconnect 7, the via contact 14 is also displaced from the lower interconnect 7. Consequently, the contact area between the lower interconnect 7 and the via contact 14 decreases and a faulty connection occurs between the lower interconnect 7 and the via contact 14. FIG. 16 shows the case where the via contact 14 is displaced from the lower interconnect 7 by the displacement size b.

(2) If he via hole 9 has a high aspect ratio, the top portion of the via hole 9 is clogged with the second copper plating layer 13 before the inner portion of the via hole 9 is filled with the second copper plating layer 13, since the speed at which the second copper plating layer 13 grows adjacent the top portion of the via hole 9 is higher than the speed at which the second copper plating layer 13 grows adjacent the bottom of the via hole 9 during the formation of the second copper plating layer 13 by electroplating. As a result, a void is produced within the via hole 9 to cause a faulty connection between the lower interconnect 7 and the upper interconnect 15.

SUMMARY OF THE INVENTION

In view of the foregoing, it is therefore an object of the present invention to prevent a reduction in the contact area between the lower interconnect and the via contact even if a mask pattern is displaced and prevent a void from being produced within the via hole during the formation of the via contact.

To attain the object, a first method of fabricating a semiconductor device according to the present invention comprises: a first step of depositing a first metal film on an insulating film on a semiconductor substrate; a second step of depositing a first interlayer insulating film on the first metal film; a third step of forming, on the first interlayer insulating film, a first mask pattern having an opening over a region in which a via hole is to be formed, etching the first interlayer insulating film by using the first mask pattern as a mask, and thereby forming a via hole in the first interlayer insulating film; a fourth step of growing a second metal film in the via hole to form a via contact composed of the second metal film and forming a recessed portion over the via contact in the via hole; a fifth step of forming, in the recessed portion, a cap layer composed of a material different from a material composing the first metal film; a sixth step of forming, on the first interlayer insulating film, a second mask pattern covering a region in which a lower interconnect is to be formed, etching the first interlayer insulating film by using the second mask pattern and the cap layer as a mask, and thereby patterning the first interlayer insulating film; a seventh step of etching the first metal film by using the cap layer and the patterned first interlayer insulating film as a mask and thereby forming a lower interconnect composed of the first metal film; an eighth step of depositing a second interlayer insulating film over an entire surface of the semiconductor substrate; a ninth step of planarizing the second interlayer insulating film and exposing the via contact or the cap layer; and a tenth step of forming, on the second interlayer insulating film, an upper interconnect to be connected to the via contact or the cap layer.

In accordance with the first method of fabricating a semiconductor device, the lower interconnect is formed by forming the cap layer composed of the material different from the material composing the first metal film such that the top surface of the via contact is covered therewith and patterning the first metal film by using the mask pattern for forming the lower interconnect and the cap layer as a mask. This ensures the formation of the lower interconnect over the entire bottom surface of the via contact covered with the cap layer even if the mask pattern for forming the lower interconnect is displaced and thereby prevents a reduction in the contact area between the lower interconnect and the via contact.

Since the first method of fabricating a semiconductor device grows the second metal film on the region of the first metal film composing the lower interconnect which is exposed in the via hole, the second metal film can be grown only from the bottom side of the via hole. This prevents the production of a void within the via hole during the formation of the via contact since the inner portion of the via hole is filled with the second metal film before the top portion of the via hole is clogged with the second metal film.

In the first method of fabricating a semiconductor device, the first metal film and the second metal film are preferably composed of the same material.

In the arrangement, the first metal film composing the lower interconnect is connected directly to the second metal film composing the via contact. Accordingly, even if electromigration occurs at continuity, the lower interconnect or the via contact is prevented from serving as a migration barrier which interrupts the movement of metal atoms. This prevents the breakage of the interconnect due to an excessive or insufficient quantity of metal atoms adjacent the junction interface between the lower interconnect and the via contact.

In this case, the first metal film and the second metal film are preferably composed of copper.

This reduces the resistance of each of the lower interconnect composed of the first metal film and the via contact composed of the second metal film.

In this case, the first step preferably includes the step of forming a first adhesion layer under the first metal film and forming a second adhesion layer on the first metal film, the third step preferably includes the step of etching the first interlayer insulating film and the second adhesion layer by using the first mask pattern as a mask and thereby forming the via hole in the first interlayer insulating film and in the second adhesion layer, and the seventh step preferably includes the step of etching the second adhesion layer, the first metal film, and the first adhesion layer by using the cap layer and the patterned first interlayer insulating film as a mask and thereby forming the lower interconnect composed of the first adhesion layer, the first metal film, and the second adhesion layer.

In the arrangement, the first adhesion layer is interposed between the first metal film composing the lower interconnect and the insulating film and the second adhesion layer is interposed between the first metal film and the first interlayer insulating film. This improves the adhesion between the lower interconnect and the insulating film or the first interlayer insulating film, while providing a direct connection between the first metal film composing the lower interconnect and the second metal film composing the via contact.

In the first method of fabricating a semiconductor device, the first step preferably includes the step of forming a first adhesion layer under the first metal film and forming a second adhesion layer on the first metal film and the seventh step preferably includes the step of etching the second adhesion layer, the first metal film, and the first adhesion layer by using the cap layer and the patterned first interlayer insulating film as a mask and thereby forming the lower interconnect composed of the first adhesion layer, the first metal film, and the second adhesion layer.

In the arrangement, the first adhesion layer is interposed between the first metal film composing the lower interconnect and the insulating film and the second adhesion layer is interposed between the first metal film and the first interlayer insulating film. This improves the adhesion between the lower interconnect and the insulating film or the first interlayer insulating film, while preventing the first metal film composing the lower interconnect from being exposed in the via hole during the formation of the via contact and thereby suppressing the oxidation of the first metal film, i.e., the lower interconnect.

Preferably, the first method of fabricating a semiconductor device further comprises, between the third step and the fourth step, the step of performing plasma processing using an argon plasma or a hydrogen plasma with respect to a portion of the first metal film exposed in the via hole.

The arrangement allows the removal of the oxide layer formed on the surface of the portion of the first metal film exposed in the via hole and thereby accelerates the growth of the second metal film in the via hole.

In the first method of fabricating a semiconductor device, the fourth step preferably includes the step of forming the via contact and the recessed portion by growing the second metal film in the via hole such that an upper portion of the via hole remains hollow.

The arrangement allows easy formation of the via contact and the recessed portion.

In the first method of fabricating a semiconductor device, the fourth step preferably includes the step of forming the via contact and the recessed portion by growing the second metal film in the via hole such that the via hole is filled completely with the second metal film and then removing a portion of the second metal film formed in an upper portion of the via hole.

The arrangement ensures the formation of the via contact and the recessed portion.

In this case, the fourth step preferably includes the step of removing the portion of the second metal film formed in the upper portion of the via hole by chemical mechanical polishing.

The arrangement allows easy removal of the portion of the second metal film formed in the upper portion of the via hole by adjusting the etching rate for the second metal film to be higher than the etching rate for the first interlayer insulating film.

In the first method of fabricating a semiconductor device, the fourth step preferably includes the step of growing the second metal film by electroplating.

The arrangement ensures the growth of the second metal film on the region of the first metal film composing the lower interconnect which is exposed in the via hole.

In this case, the fourth step preferably includes the step of growing the second metal film by using the first metal film as a cathode for plating.

The arrangement allows easy growth of the second metal film.

In the first method of fabricating a semiconductor device, the fourth step preferably includes the step of growing the second metal film by electroless plating or CVD.

The arrangement ensures the growth of the second metal film on the region of the first metal film composing the lower interconnect which is exposed in the via hole.

In the first method of fabricating a semiconductor device, the first metal film is preferably composed of copper and the cap layer is preferably composed of tungsten, gold, silver, nickel, niobium, or paradium.

The arrangement ensures the use of the cap layer as a mask in patterning the first metal film and thereby forming the lower interconnect.

In the first method of fabricating a semiconductor device, the fifth step preferably includes the step of forming the cap layer by supplying, onto the semiconductor substrate, a reactive gas which selectively reacts with the second metal film.

This allows easy formation of the cap layer.

In this case, the second metal film is preferably composed of copper and the reactive gas preferably contains silicon.

This ensures the formation of the cap layer composed of the copper silicide.

In the first method of fabricating a semiconductor device, the ninth step preferably includes the step of leaving at least a lower portion of the cap layer and the tenth step preferably includes the step of forming the upper interconnect by performing patterning, while protecting a top surface of the via contact with the remaining cap layer.

The arrangement prevents the removal of the top surface of he via contact even if the mask pattern for forming the upper interconnect is displaced from the via contact.

In the first method of fabricating a semiconductor device, the ninth step preferably includes the step of etching back the second interlayer insulating film and the cap layer to remove the cap layer and cause an upper portion of the via contact to protrude from a top surface of the second interlayer insulating film and the tenth step includes the step of forming a third adhesion layer over the second interlayer insulating film except for a top surface of the via contact, depositing successively a third metal film composed of the same material as composing the second metal film and a fourth adhesion layer on a top surface of the third adhesion layer including the top surface of the via contact, patterning the third adhesion layer, the third metal film, and the fourth adhesion layer, and thereby forming the upper interconnect composed of the third adhesion layer, the third metal film, and the fourth adhesion layer.

In the arrangement, the second metal film, i.e., the via contact and the third metal film composing the upper interconnect are composed of the same material and the via contact is connected directly to the third metal film. Accordingly, even if electromigration occurs at continuity, the via contact or the upper interconnect is prevented from serving as a migration barrier which interrupts the movement of metal atoms. This prevents the breakage of the interconnect due to an excessive or insufficient quantity of metal atoms adjacent the junction interface between the upper interconnect and the via contact.

A second method of fabricating a semiconductor device according to the present invention comprises: a first step of depositing a first metal film on an insulating film on a semiconductor substrate; a second step of depositing a first interlayer insulating film on the first metal film; a third step of forming, on the first interlayer insulating film, a first mask pattern having an opening over a region in which a via hole is to be formed, etching the first interlayer insulating film by using the first mask pattern as a mask, and thereby forming a via hole in the first interlayer insulating film; a fourth step of growing a second metal film composed of a material different from a material composing the first metal film to form a via contact composed of the second metal film; a fifth step of forming, on the first interlayer insulating film, a second mask pattern covering a region in which a lower interconnect is to be formed, etching the first interlayer insulating film by using the second mask pattern and the via contact as a mask, and thereby patterning the first interlayer insulating film; a sixth step of etching the first metal film by using the via contact and the patterned first interlayer insulating film as a mask to form a lower interconnect composed of the first metal film; a seventh step of depositing second interlayer insulating film over the entire surface of the semiconductor substrate; an eighth step of planarizing the second interlayer insulating film and exposing the via contact; and a ninth step of forming, on the second interlayer insulating film, an upper interconnect to be connected to the via contact.

In accordance with the second method of fabricating a semiconductor device, the lower interconnect is formed by forming the via contact composed of the material different from the material composing the first metal film and patterning the first metal film by using the mask pattern for forming the lower interconnect and the via contact as a mask. This ensures the formation of the lower interconnect over the entire bottom surface of the via contact even if the mask pattern for forming the lower interconnect is displaced and prevents a reduction in the contact area between the lower interconnect and the via contact.

Since the second method of fabricating a semiconductor device grows the second metal film on the region of the first metal film composing the lower interconnect which is exposed in the via hole, the second metal film can be grown only from the bottom side of the via hole. This prevents the production of a void within the via hole during the formation of the via contact since the inner portion of the via hole is filled with the second metal film before the top portion of the via hole is clogged with the second metal film.

In the second method of fabricating a semiconductor device, the first metal film is preferably composed of copper and the second metal film is preferably composed of tungsten, gold, silver, nickel, niobium, or paradium.

The arrangement ensures the use of the via contact as a mask in patterning the first metal film and thereby forming the lower interconnect.

In the second method of fabricating a semiconductor device, the first step preferably includes the step of forming a first adhesion layer under the first metal film and forming a second adhesion layer on the first metal film and the seventh step preferably includes the step of etching the second adhesion layer, the first metal film, and the first adhesion layer by using the cap layer and the patterned first interlayer insulating film as a mask and thereby forming the lower interconnect composed of the first adhesion layer, the first metal film, and the second adhesion layer.

In the arrangement, the first adhesion layer is interposed between the first metal film composing the lower interconnect and the insulating film and the second adhesion layer is interposed between the first metal film and the first interlayer insulating film. This improves the adhesion between the lower interconnect and the insulating film or the first interlayer insulating film, while preventing the first metal film composing the lower interconnect from being exposed in the via hole during the formation of the via contact and thereby suppressing the oxidation of the first metal film, i.e., the lower interconnect.

Preferably, the second method of fabricating a semiconductor device further comprises, between the third step and the fourth step, the step of performing plasma processing using an argon plasma or a hydrogen plasma with respect to a portion of the first metal film exposed in the via hole.

The arrangement allows the removal of the oxide layer formed on the surf ace of the portion of the first metal film exposed in the via hole and thereby accelerates the growth of the second metal film in the via hole.

In the second method of fabricating a semiconductor device, the fourth step preferably includes the step of forming the via contact by growing the second metal film in the via hole till a surface of the second metal film becomes higher in level than a surface of the first interlayer insulating film and then removing a portion of the second metal film higher in level than the surface of the first interlayer insulating film.

The arrangement ensures the formation of the via contact.

In the second method of fabricating a semiconductor device, the fourth step preferably includes the step of growing the second metal film by electroplating.

The arrangement ensures the growth of the second metal film on the region of the first metal film composing the lower interconnect which is exposed in the via hole.

In this case, the fourth step preferably includes the step of growing the second metal film by using the first metal film as a cathode for plating.

The arrangement allows easy growth of the second metal film.

In the second method of fabricating a semiconductor device, the fourth step preferably includes the step of growing the second metal film by electroless plating or CVD.

The arrangement ensures the growth of the second metal film on the region of the first metal film composing the lower interconnect which is exposed in the via hole.

In the second method of fabricating a semiconductor device, the fourth step preferably includes the step of forming the second metal film by supplying, onto the semiconductor substrate, a reactive gas which selectively reacts with the first metal film.

The arrangement ensures easy growth of the second metal film on the region of the first metal film composing the lower interconnect which is exposed in the via hole.

In this case, the first metal film is preferably composed of copper and the reactive gas preferably contains silicon.

This ensures the growth of the second metal film composed of the copper silicide.

A semiconductor device according to the present invention comprises: a lower interconnect formed on a semiconductor substrate; an interlayer insulating film deposited on the lower interconnect; a via contact formed in the interlayer insulating film to be connected to the lower interconnect; and an upper interconnect formed on the interlayer insulating film to be connected to the lower interconnect through the via contact, the lower interconnect and the via contact being composed of the same material, the via contact being connected directly to a top surface of the lower interconnect without extending off the top surface of the lower interconnect.

In the semiconductor device according to the present invention, the lower interconnect and the via contact are composed of the same material and the via contact is connected directly to the top surface of the lower interconnect. Accordingly, even if electromigration occurs at continuity, the lower interconnect or the via contact is prevented from serving as a migration barrier which interrupts the movement of metal atoms. This prevents the breakage of the interconnect due to an excessive or insufficient quantity of metal atoms adjacent the junction interface between the lower interconnect and the via contact.

BRIEF DESCRIPTION OF THE DRAWINGS

FIG. 5 illustrates the process of forming a via contact by selectively growing a copper film in a via hole by electroplating in the method of fabricating a semiconductor device according to the first embodiment;

DETAILED DESCRIPTION OF THE INVENTION

Embodiment 1

A semiconductor device and a method of fabricating the same according to a first embodiment of the present invention will be described with reference to the drawings.

FIG. 1(a) to 1(c), FIGS. 2(a) to 2(c), FIGS. 3(a) to 3(c), and FIGS. 4(a) to 4(c) are cross-sectional views illustrating the individual process steps of the method of fabricating a semiconductor device according to the first embodiment.

Figure 1A:
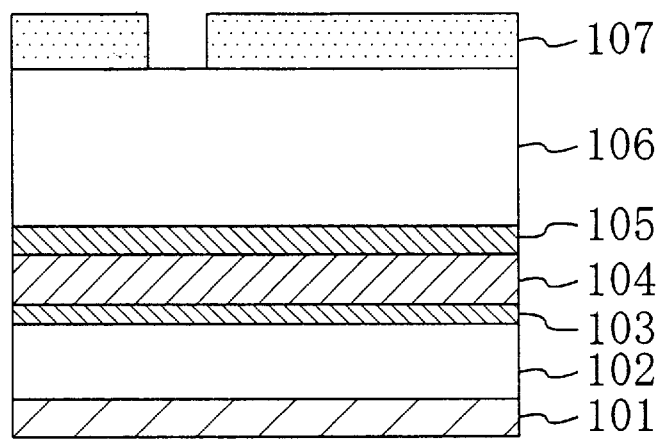
FIGS. 1(a) to 1(c) are cross-sectional views illustrating the individual process steps of a method of fabricating a semiconductor device according to a first embodiment.

First, as shown in FIG. 1(a), an insulating film 102 is deposited on a semiconductor substrate 101 that has been formed preliminarily with a semiconductor active element (not shown) Then, a first adhesion layer 103 composed of, e.g., a tantalum alloy film, a first metal film 104 composed of, e.g., a copper film, and a second adhesion layer 105 composed of, e.g., a tantalum alloy film are formed successively on the insulating film 102. Thereafter, a first interlayer insulating film 106 composed of, e.g., a silicon oxide film is deposited on the second adhesion layer 105.

The resulting multilayer thin film composed of the first adhesion layer 103, the first metal film 104, and the second adhesion layer 105 has a thickness of about 350 nm and the first interlayer insulating film 106 has a thickness of about 1500 nm.

Figure 1B:
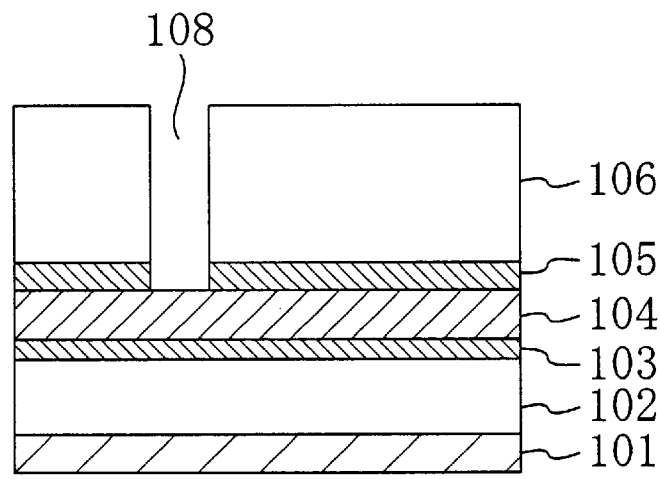

Next, a first resist pattern 107 having an opening over a region in which a via hole is to be formed is formed on the first interlayer insulating film 106. Subsequently, dry etching is performed successively with respect to the first interlayer insulating film 106 and the second adhesion layer 105 by using the first resist pattern 107 as a mask, thereby forming a via hole 108 in the second adhesion layer 105 and in the first interlayer insulating film 106, as shown in FIG. 1(b). After that, the first resist pattern 107 is removed by ashing.

Figure 1C:
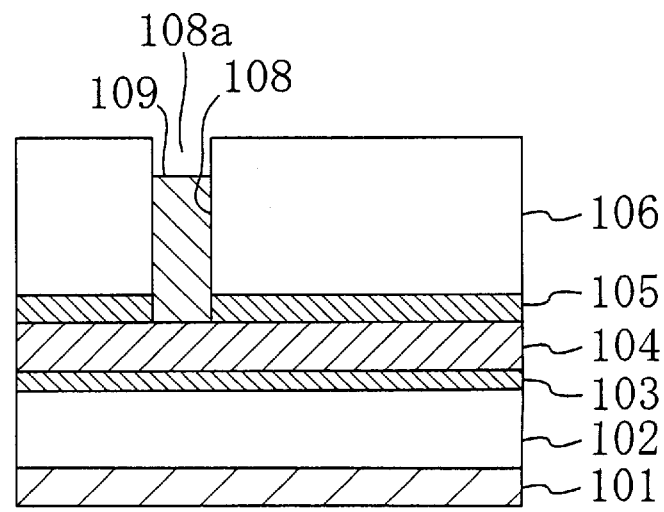

Next, as shown in FIG. 1(c), a second metal film, specifically a copper film, is grown selectively on a region of the first metal film 104 exposed in the via hole 108 by using, e.g., electroplating, thereby forming a via contact 109 composed of the copper film. At this time, the copper film is grown such that an upper portion of the via hole 108 remains hollow, whereby a recessed portion 108a having a depth of about 300 nm is formed over the via contact 109 in the via hole 108. This allows easy formation of the via contact 109 and the recessed portion 108a.

FIG. 5 illustrates the process of forming the via contact 109 by selectively growing the copper film in the via hole 108 by electroplating.

As shown in FIG. 5, the semiconductor substrate 101 is immersed in a plating solution 151 composed of a copper sulfate solution containing a specified additive agent, which has been reserved in a plating tank (not shown). When a cathode electrode 152 of electroplating equipment (not shown) is connected to the portion of the first metal film 104 exposed at a wafer edge of the semiconductor substrate 101, electrons are supplied from the cathode electrode 152 to the first metal film 104 so that the first metal film 104 serves as a cathode for plating. This allows selective deposition of the copper film on the region of the first metal film 104 exposed in the via hole 108.

It is to be noted that the first and second adhesion layers 103 and 10S are not depicted in FIG. 5.

Figure 2A:
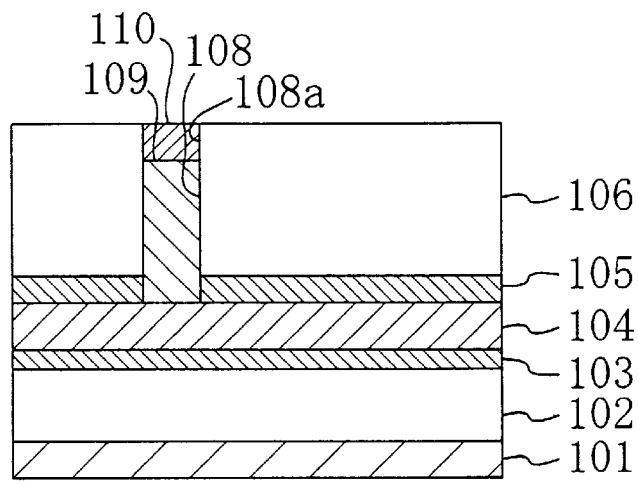
FIGS. 2(a) to 2(c) are cross-sectional views illustrating the individual process steps of the method of fabricating a semiconductor device according to the first embodiment.

Next, as shown in FIG. 2(a), a tungsten film is grown by, e.g., selective CVD in the recessed portion 108a to form a cap layer 110 composed of the tungsten film.

Although the first embodiment has used selective CVD for the formation of the cap layer 110, it is also possible to form the cap layer 110 composed of the tungsten film in the recessed portion 108a by a blanket tungsten process, in which a tungsten film is deposited on the first interlayer insulating film 106 including the recessed portion 108a and the portion of the tungsten film exposed on the first interlayer insulating film 106 is removed.

Figure 2B:
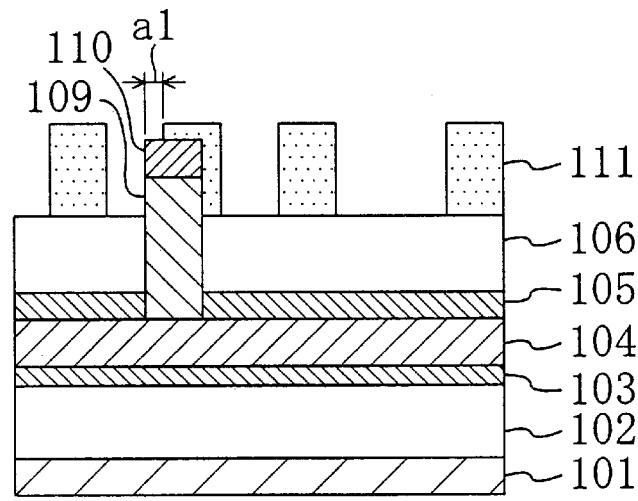

Next, as shown in FIG. 2(b), the first interlayer insulating film 106 is etched back by a thickness of about 1000 nm to have a thickness of about 500 nm such that the via contact 109 and the cap layer 110 protrude from the top surface of the first interlayer insulating film 106. Then, a second resist pattern 111 is formed on the first interlayer insulating film 106, the via contact 109, and the cap layer 110 to mask a region in which a lower interconnect is to be formed. It is to be noted hat FIG. 2(b) shows the case where the second resist pattern 111 is displaced from the via contact 109 by a displacement size a1.

Figure 2C:
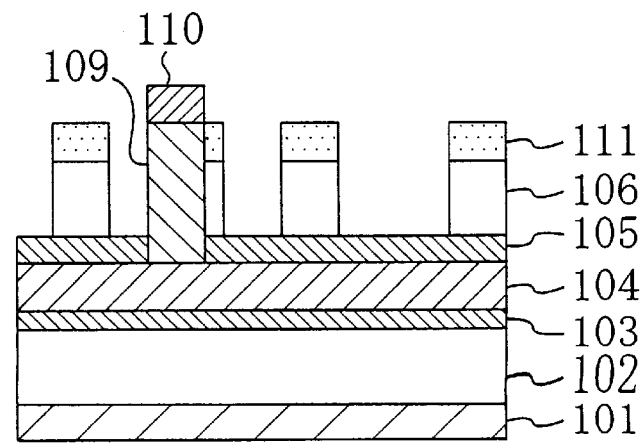

Next, as shown in FIG. 2(c), dry etching using a CF-containing etching gas for removing the oxide film is performed at a low temperature with respect to the first interlayer insulating film 106 by using the second resist pattern 111 and the cap layer 110 as a mask, thereby patterning the first interlayer insulating film 106.

Figure 3A:
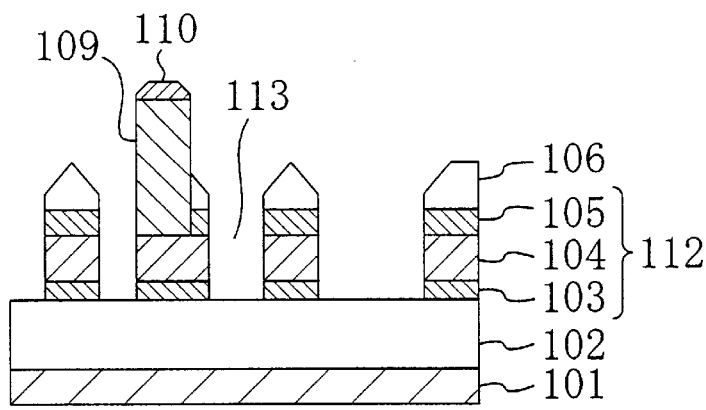
FIGS. 3(a) to 3(c) are cross-sectional views illustrating the individual process steps of the method of fabricating a semiconductor device according to the first embodiment.

Next, as shown in FIG. 3(a), dry etching using a Cl-containing etching gas for removing the copper film and the tantalum-containing metal film is performed successively with respect to the second adhesion layer 105, the first metal film 104, and the first adhesion layer 103 by using the cap layer 110 and the patterned first interlayer insulating film 106 as a mask, thereby forming a lower interconnect 112 composed of the first adhesion layer 103, the first metal film 104, and the second adhesion layer 105.

At this time, the cap layer 110 not only serves as an etching stopper for dry etching using the CF-containing etching gas or the Cl-containing etching gas but also remains even at the completion of dry etching. Consequently, the via contact 109 remains in a perfect configuration and the lower interconnect 112 is formed reliably over the entire bottom surface of the via contact Between the adjacent lower interconnects 112 on the semiconductor substrate 101, there is formed an interconnect gap 113.

Figure 3B:
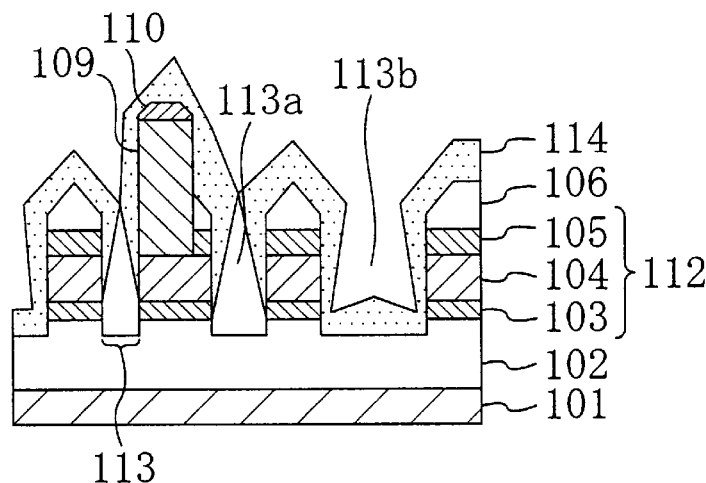

Next, as shown in FIG. 3(b), dry etching using a F-containing etching gas is performed with respect to the insulating film 102 by using the cap layer 110 and the patterned first interlayer insulating film 106 as a mask, thereby partially removing the region disposed between the adjacent lower interconnects 112 and in the upper portion of the insulating film 102 by about a thickness of 300 nm. After that, a second interlayer insulating film 114 composed of a $SiO_2$ film is deposited on the insulating film 102, the first interlayer insulating film 106, 112 by using a $SiH_4/N_2O$-containing gas plasma in, e.g., plasma CVD equipment.

Since the step coverage of the $SiO_2$ film deposited by using the $SiH_4/N_2O$-containing gas plasma is poor, if the groove formed in the interconnect gap 113 has a high aspect ratio, a void 113a is produced with in the interconnect gap 113 in the second interlayer insulating film 114. If the groove formed in the interconnect gap 113 has a low aspect ratio, a gap portion 113b is formed internally of the second interlayer insulating film 114 deposited over the wall surface and bottom portion of the groove.

In the present embodiment, it is preferable to remove, prior to the deposition of the second interlayer insulating film 114, a copper oxide film formed on the side surfaces of the first metal film 104 composing the lower interconnect 112 and the via contact 109 by performing plasma processing using a hydrogen plasma or an ammonia plasma with respect to the side surfaces of the first metal film 104 and the via contact 109 and then deposit an extremely thin film of SiN, SiON, or the like for preventing reoxidization, though they are not depicted in the drawings.

Figure 3C:
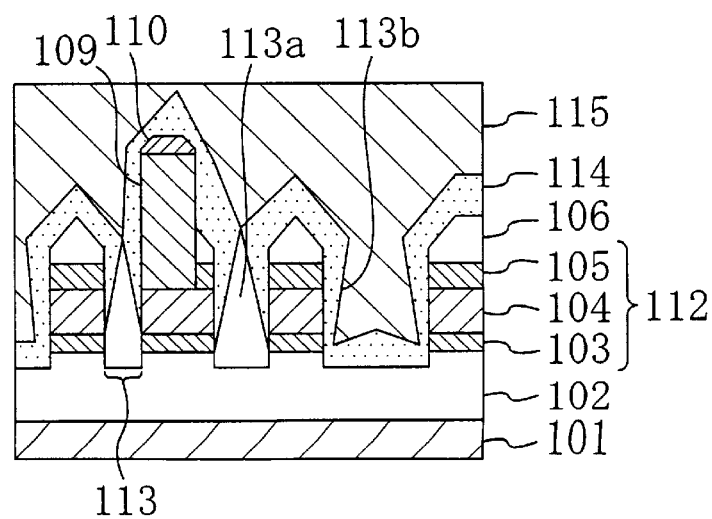

Next, as shown in FIG. 3(c), a third interlayer insulating film 115 composed of a $SiO_2$ film is deposited over the entire surface of the second interlayer insulating film 114 including the gap portion 113b by using, e.g., high-density plasma (HDP) CVD equipment.

Since the step coverage of the $SiO_2$ film deposited by using the high-density plasma is excellent, the gap portion 113b is filled completely with the third interlayer insulating film 115.

Since the second and third interlayer insulating films 114 and 115 have been deposited such that the void 113b is produced within the interconnect gap 113 as shown in FIGS. 3(b) and 3(c), the specific inductive capacity, i.e., capacitance between the adjacent lower interconnects 112 can be reduced.

Figure 4A:
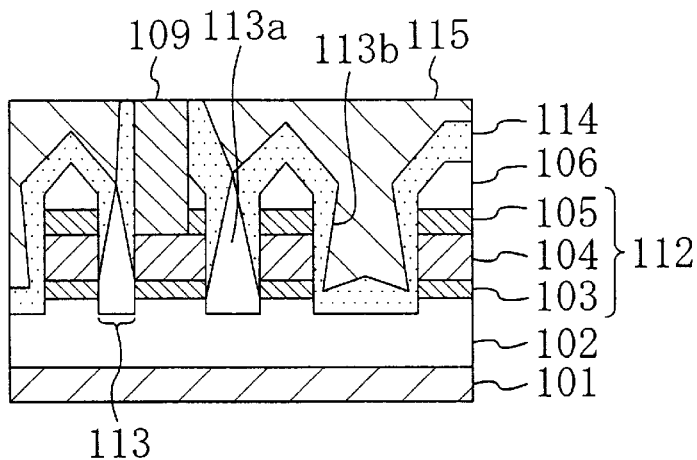
FIGS. 4(a) to 4(c) are cross-sectional views illustrating the individual process steps of the method of fabricating a semiconductor device according to the first embodiment.

Next, as shown in FIG. 4(a), the cap layer 110 is removed and the third interlayer insulating film 115 is planarized by, e.g., CMP such that the top surface of the via contact 109 is exposed.

At this time, since the top surface of the via contact 109 is higher in level than the upper end of the first interlayer insulating film 106, i.e., the upper end of the void 113a, it is possible to adjust the top surface of the planarized third interlayer insulating film 115 to be higher in level than the upper end of the void 113a by halting the polishing of the third interlayer insulating film 115 using CMP at the top surface of the via contact 109, i.e., by using the via contact 109 as an etching stopper. After the third interlayer insulating film 115 is planarized by CMP, the void 113a is prevented from forming an opening in the top surface of the planarized third interlayer insulating film 115.

Figure 4B:
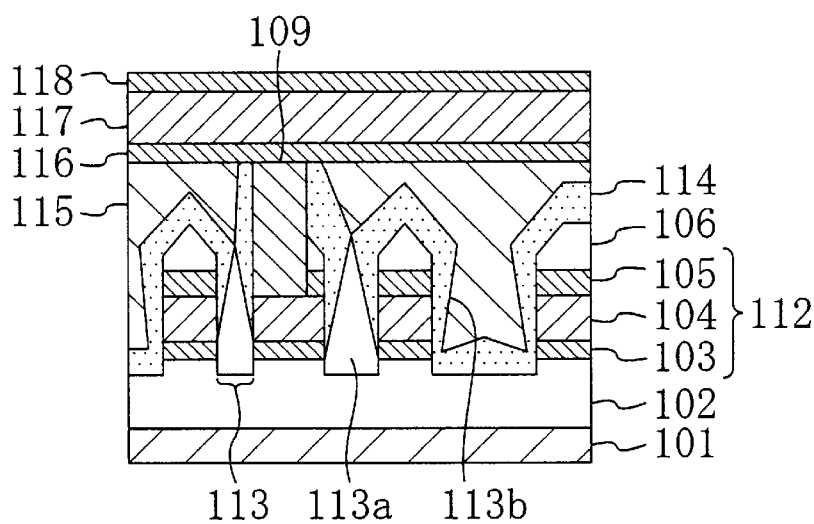

Next, as shown in FIG. 4(b), a third adhesion layer 116 composed of, e.g., a tantalum alloy film, a third metal film 117 composed of, e.g., a copper film, and a fourth adhesion layer 118 composed of, e.g., a tantalum alloy film are formed successively on the top surface of the third interlayer insulating film 115 including the top surface of the via contact 109.

Figure 4C:
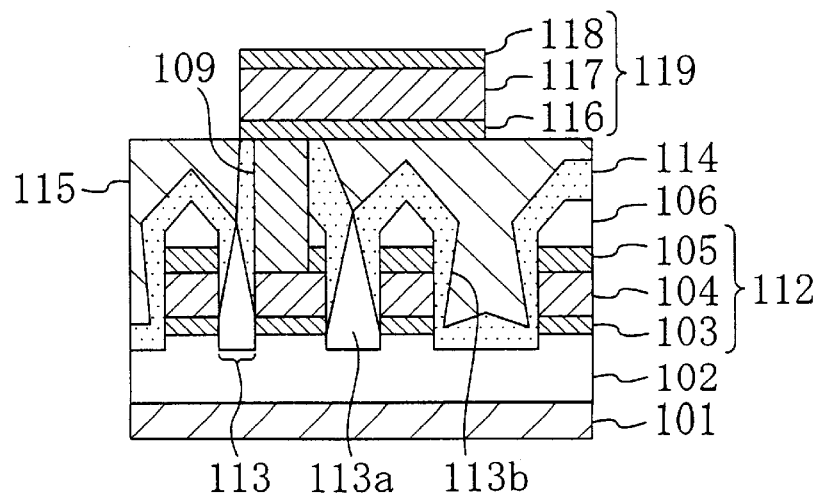

Next, a resist pattern (not shown) covering a region in which an upper interconnect is to be formed is formed on the fourth adhesion layer 118. Then, dry etching is performed successively with respect to the fourth adhesion layer 118, the third metal film 117, and the third adhesion layer 116 by using the resist pattern as a mask, thereby forming an upper interconnect 119 which is composed of the third adhesion layer 116, the third metal film 117, and the fourth adhesion layer 118 and to be connected to the via contact 109, as shown in FIG. 4(c).

Thus, according to the first embodiment, the lower interconnect 112 is formed by forming the cap layer 110 composed of the material different from the material of the first metal film 104 such that the top surface of the via contact 109 is covered therewith and patterning the first metal film 104 by using the mask pattern for forming the lower interconnect and the cap layer 110 as a mask. Even when the mask pattern for forming the lower interconnect is displaced, the lower interconnect 112 is formed reliably over the entire bottom surface of the via contact 109 covered with the cap layer 110, so that a reduction in the contact area between the lower interconnect 112 and the via contact 109 is prevented.

According to the first embodiment, it is also possible to grow the cooper film only from the bottom side of the via hole 108 since the copper film is grown on the region of the first metal film 104 composing the lower interconnect 112 which is exposed in the via hole 108. This prevents the production of the void within the via hole 108 during the formation of the via contact 109 since the inner portion of the via hole 108 is filled with the copper film before the top portion thereof is clogged with the copper film.

In addition, the first embodiment has used copper as the material of each of the first metal film 104 composing the lower inter connect 112 and the via contact 109 which is connected directly to the first metal film 104. If different metals are connected to each other in wiring and electromigration occurs at continuity, one of the metals forms a migration barrier against the other of the metals to interrupt the movement of metal atoms. As a result, the wiring may be broken due to an excessive or insufficient quantity of metal atoms adjacent the function interface between the two metals. However, since the lower interconnect 112 and the via contact 109 are composed of the same material and connected directly to each other, the lower interconnect 112 or the via contact 109 is prevented from serving as a migration barrier which interrupts the movement of metal atoms. This prevents the breakage of the wiring due to an excessive or insufficient quantity of metal atoms adjacent the junction interface between the lower interconnect 112 and the via contact 109.

Moreover, since the first embodiment has interposed the first adhesion layer 103 and the second adhesion layer 105 between the first metal film 104 composing the lower interconnect 112 and the insulating film 102 and between the first metal film 104 and the first interlayer insulating film 106, respectively, the adhesion between the lower interconnect 112 and the insulating film 102 or the first interlayer insulating film 106 is improved.

Although the first embodiment has used copper as the material of each of the first metal film 104 and the via contact 109, another metal may also be used as the material of each of the first metal film 104 and the via contact 109 instead of copper.

Although the first embodiment has used electroplating in forming the via contact 109, electroless plating, selective CVD, or like method may also be used instead of electroplating.

Although the first embodiment has used copper and tungsten as the respective materials of the first metal film 104 and the cap layer 110, it is also possible to use a combination of other different metals as the respective materials of the first metal film 104 and the cap layer 110 instead of copper and tungsten. Specifically, gold (Au), silver (Ag), nickel (Ni), platinum (Pt), niobium (Nb), paradium (Pd), or the like may be used as the material of the cap layer 110 instead of tungsten if copper is used as the material of the first metal film 104.

Although the first embodiment has formed the first adhesion layer 103 under the first metal film 104 and the second adhesion layer 105 on the first metal film 104, the first or second adhesion layer 103 or 105 may not be formed.

First Variation of Embodiment 1

A method of fabricating a semiconductor device according to a first variation of the first embodiment of the present invention will be described with reference to the drawings.

Figure 6A:
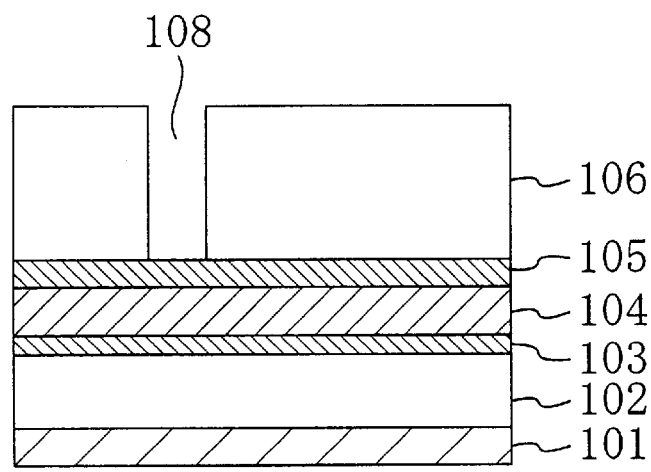
FIGS. 6(a) and 6(b) are cross-sectional views illustrating the individual process steps of a method of fabricating a semiconductor device according to a first variation of the first embodiment.
Figure 6B:
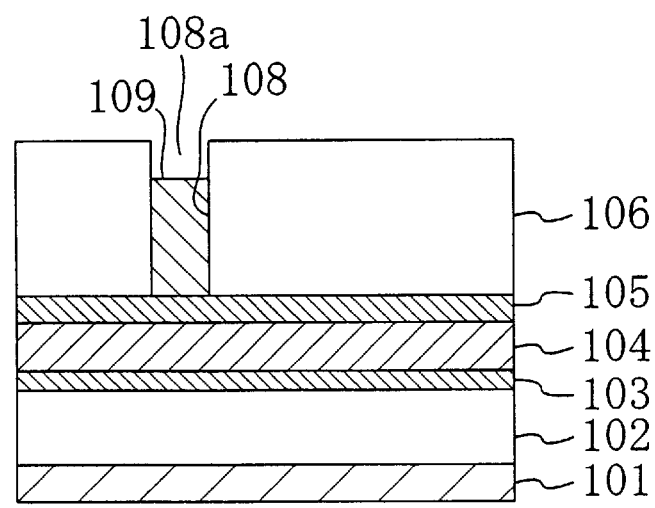

FIGS. 6(a) and 6(b) are cross-sectional views illustrating the individual process steps of the method of fabricating a semiconductor device according to the first variation of the first embodiment.

The fabrication method of the first variation is different from that of the first embodiment in that the dry etching process using the first resist pattern 107 as a mask (see FIG. 1(a)) is performed only with respect to the first interlayer insulating film 106 to form the via hole 108 in the first interlayer insulating film 106, as shown in FIG. 6(a), and then the via contact 109 is formed or the region of the second adhesion layer 105 exposed in the via hole 108, as shown in FIG. 6(b).

The process steps subsequent to the step illustrated in FIG. 6(b) according to the first variation of the first embodiment are the same as the process steps subsequent to the step illustrated in FIG. 2(a) according to the first embodiment except that the second adhesion layer 105 is interposed between the first metal film 104 and the via contact 109.

Since the first variation of the first embodiment prevents the first metal film 104 composing the lower interconnect 112 from being exposed in the via hole 108 during the formation of the via contact 109, the oxidization of the first metal film 104 is suppressed so that the reliability of the lower interconnect 112 is improved.

Second Variation of Embodiment 1

A method of fabricating a semiconductor device according to a second variation of the first embodiment of the present invention will be described with reference to the drawings.

Figure 7A:
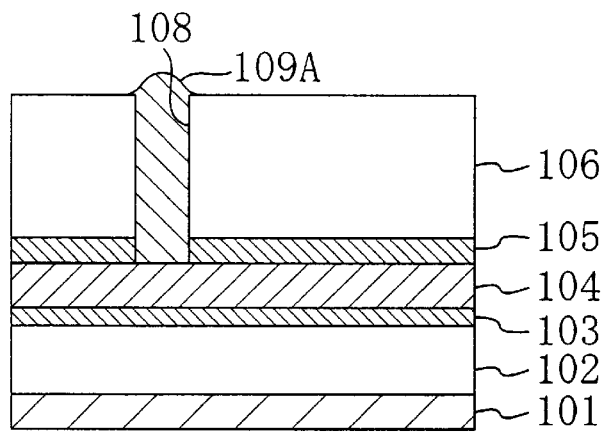
FIGS. 7(a) and 7(b) are cross-sectional views illustrating the individual process steps of a method of fabricating a semiconductor device according to a second variation of the first embodiment.
Figure 7B:
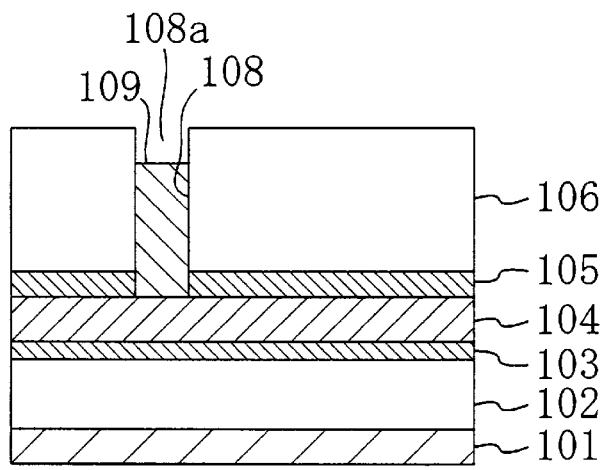

FIGS. 7(a) and 7(b) are cross-sectional views illustrating the individual process steps of the method of fabricating a semiconductor device according to the second variation.

The first aspect in which the fabrication method of the second variation is different from that of the first embodiment is that plasma processing using an argon plasma or a hydrogen plasma is performed with respect to the portion of the first metal film 104 exposed in the via hole 108 between the step of forming the via hole 108 (see FIG. 1(b)) and the step of forming the via contact 109 (see FIG. 1(c)), thereby performing the step of removing the oxide layer formed on the surface of the exposed portion.

The second aspect in which the fabrication method of the second variation is different from that of the first embodiment is that the step of forming the via contact 109 (see FIG. 1(c)) includes growing the second metal film 109A (specifically a copper film) in the via hole 108 such that the via hole 108 is filled completely with the second metal film 109A, as shown in FIG. 7(a)) and then removing the portion of the second metal film 109A formed in the upper portion of the via hole 108, as shown in FIG. 7(b), thereby forming the via contact 109 composed of the second metal film 109A and simultaneously forming a recessed portion 108a over the via contact 109 in the via hole 108.

It is to be noted that the process steps subsequent to the step illustrated in FIG. 7(b) according to the second variation of the first embodiment are the same as the process steps subsequent to the step illustrated in FIG. 2(a) according to the first embodiment.

Since the second variation of the first embodiment has performed the plasma processing with respect to the portion of the first metal film 104 exposed in the via hole 108 and thereby removed the oxide layer formed on the surface of the exposed portion, the growth of the second metal film 109A in the via hole 108 can be accelerated.

In addition, since the second variation of the first embodiment has formed the via contact 109 and the recessed portion 108a by growing the second metal film 109A in the via hole 108 such that the via hole 108 is filled completely with the second metal film 109A and then removing the portion of the second metal film 109A formed in the upper portion of the via hole 108, the via contact 109 and the recessed portion 108a can be formed reliably.

In the second variation of the first embodiment, the portion of the second metal film 109A formed in the upper portion of the via hole 108 is preferably removed by chemical mechanical polishing (CMP) in the step illustrated in FIG. 7(b). If the etching rate for the second metal film 109A is adjusted to be higher than the etching rate for the first interlayer insulating film 106, the portion of the second metal film 109A formed in the upper portion of the via hole 108 can be removed easily by CMP. Specifically, if a copper film and a silicon oxide film are used as the second metal film 109A and the first interlayer insulating film 106, respectively, the portion of the second metal film 109A formed in the upper portion of the via hole 108 is preferably removed by CMP using alumina or the like as a slurry.

Third Variation of Embodiment 1

A method of fabricating a semiconductor device according to a third variation of the first embodiment of the present invention will be described with reference to the drawings.

The fabrication method of the third variation is different from that of the first embodiment in that, during the formation of the cap layer 110 on the via contact 109 (see FIG. 2(a)), a copper silicide layer is formed selectively by exposing the top surface of the via contact 109 to a gas containing silane at a high temperature of about 400° C., whereby the cap layer 110 composed of the copper silicide layer is formed.

Since the third variation of the first embodiment has formed the cap layer 110 composed of the copper silicide layer by using the gas containing silane which selectively reacts with copper composing the via contact 109, the cap layer 110 can be formed easily.

Although the third variation of the first embodiment has formed the cap layer 110 composed of the copper silicide layer by using the gas containing silane, it is also possible to form the cap layer 110 composed of an AlCu film by using another reactive gas which selectively reacts with copper such as TMAH (trimethylaluminum hydride).

Embodiment 2

A method of fabricating a semiconductor device according to a second embodiment of the present invention will be described with reference to the drawings.

Since the second embodiment performs the same process steps as illustrated in FIGS. 1(a) to 1(c), FIGS. 2(a) to 2(c), and FIGS. 3(a) to 3(c) in accordance with the method of fabricating a semiconductor device of the first embodiment, the description will be given to the process steps subsequent to the step illustrated in 3(c) with reference to FIGS. 8(a) to 8(c).

Figure 8A:
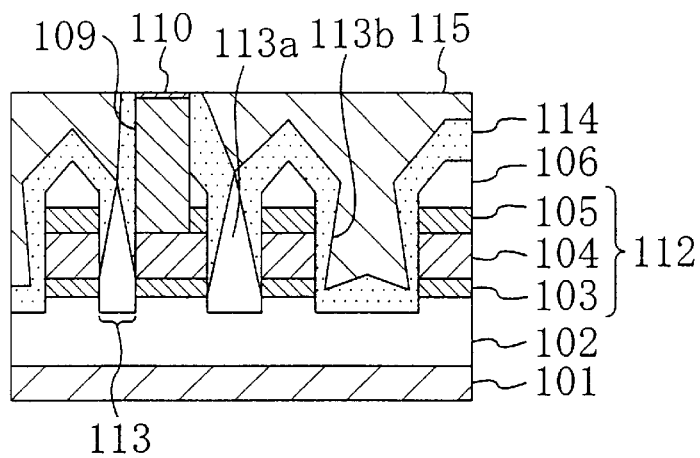
FIGS. 8(a) to 8(c) are cross-sectional views illustrating the individual process steps of a method of fabricating a semiconductor device according to a second embodiment.

First, as shown in FIG. 8(a), the upper portion of the cap layer 110 is removed by, e.g., CMP and the third interlayer insulating film 115 is planarized such that the top surface of the remaining cap layer 110 is exposed.

Figure 8B:
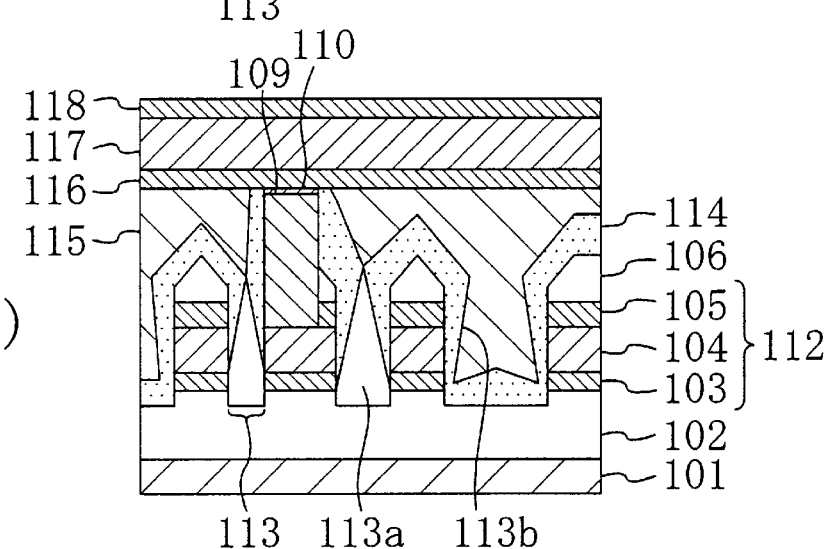
Figure 8C:
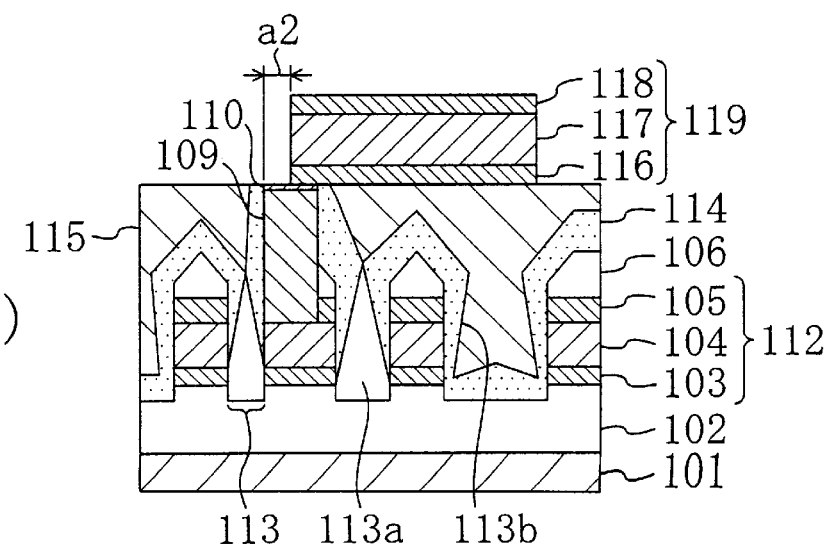

Next, as shown in FIG. 8(b), a third adhesion layer 116 composed of, e.g., a tantalum alloy film, a third metal film 117 composed of, e.g., a copper film, and a fourth adhesion layer 118 composed of, e.g., a tantalum alloy film are formed successively on the top surface of the third interlayer insulating film 115 including the top surface of the remaining cap layer 110.

Next, a resist pattern (not shown) covering the upper-interconnect formation region is formed on the fourth adhesion layer 118. Then, dry etching is performed successively with respect to the fourth adhesion layer 118, the third metal film 117, and the third adhesion layer 116 by using the resist pattern as a mask, thereby forming the upper interconnect 119 which is composed of the third adhesion layer 116, the third metal film 117, and the fourth adhesion layer 118 and to be connected to the via contact 109 through the remaining cap layer 110, as shown in FIG. 8(c). It is to be noted that FIG. 8(c) illustrates the case where the resist pattern covering the upper-interconnect formation region, i.e., the upper interconnect 119 is displaced from the via contact 109 by the displacement size a2 and the remaining cap layer 110 is exposed.

The second embodiment achieves the following effect in addition to the effects achieved by the first embodiment.

That is, since the upper interconnect 119 has been formed by performing patterning while protecting the top surface of the via contact 109 with the cap layer 110, the removal of the top surface of the via contact 109 can be prevented even if the mask pattern for forming the upper interconnect is displaced from the via contact 109, so that the reliability of the via contact 109 is improved.

Embodiment 3

A method of fabricating a semiconductor device according to a third embodiment of the present invention will be described with reference to the drawings.

Since the third embodiment performs the same process steps as illustrated in FIGS. 1(a) to 1(c), FIGS. 2(a) to 2(c), FIGS. 3(a) to 3(c), and FIG. 4(a) in accordance with the method of fabricating a semiconductor device of the first embodiment, the description will be given to the process steps subsequent to the step illustrated in FIG. 4(a) with reference to FIGS. 9(a) and 9(b) and FIGS. 10(a) and 10(b).

Figure 9A:
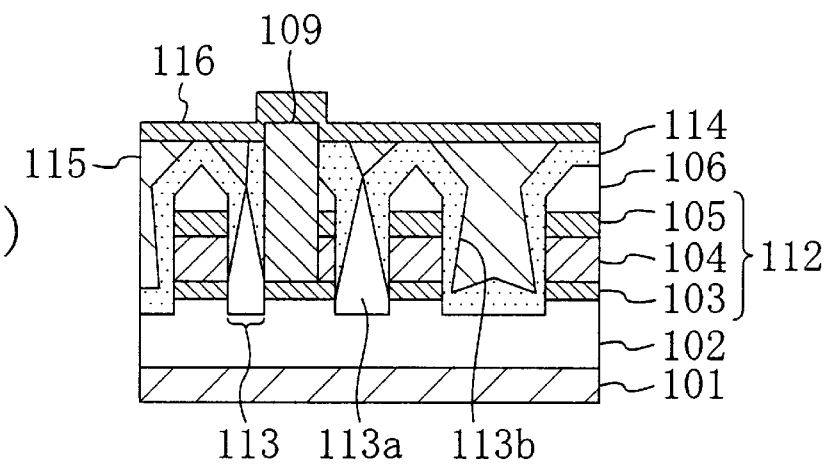
FIGS. 9(a) and 9(b) are cross-sectional views illustrating the individual process steps of a method of fabricating a semiconductor device according to a third embodiment.

First, as shown in FIG. 9(a), wet etching is performed by way of example with respect to the third interlayer insulating film 115, thereby causing the upper portion of the via contact insulating film 115. Then, the third adhesion layer 116 composed of, e.g., a tantalum alloy film is deposited on the top surface of the third interlayer insulating film 115 including the top surface of the via contact 109.

Figure 9B:
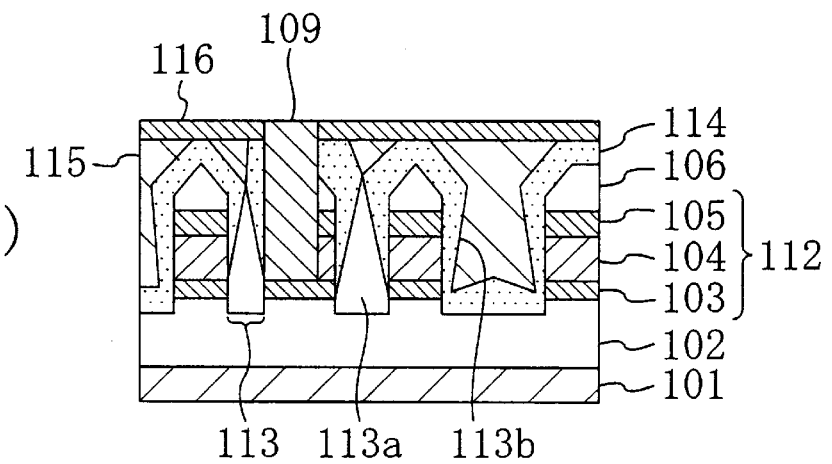
Figure 10A:
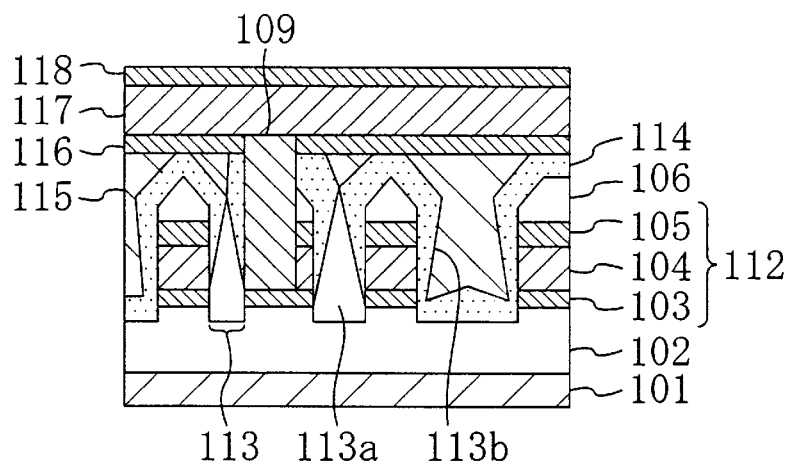
FIGS. 10(a) and 10(b) are cross-sectional views illustrating the individual process steps of the method of fabricating a semiconductor device according to the third embodiment.

Next, as shown in FIG. 9(b), the third adhesion layer 116 is planarized by, e.g., CMP such that the top surface of the via contact 109 is exposed. Then, as shown in FIG. 10(a), the third metal film 117 composed of, e.g., a copper film and the fourth adhesion layer 118 composed of, e.g., a tantalum alloy film are deposited sequentially on the top surface of the third adhesion layer 116 including the top surface of the via contact 109.

Figure 10B:
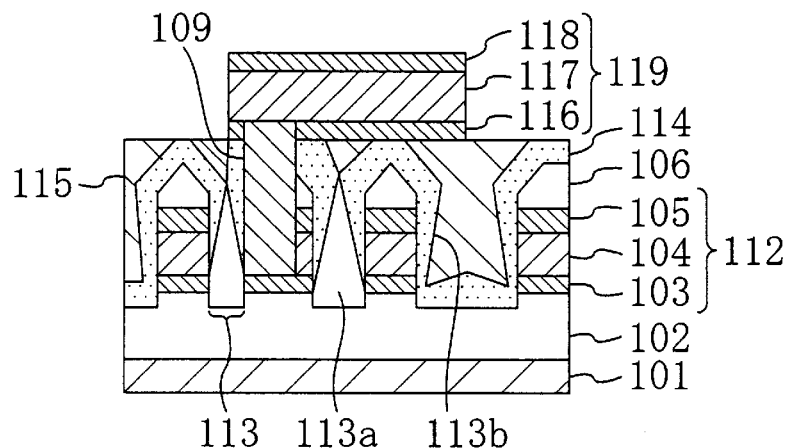

Next, a resist pattern (not shown) covering the upper-interconnect formation region is formed on the fourth adhesion layer 118. Then, dry etching is performed successively with respect to the fourth adhesion layer 118, the third metal film 117, and the third adhesion layer 116 by using the resist pattern as a mask, thereby forming the upper interconnect 119 which is composed of the third adhesion layer 116, the third metal film 117, and the fourth adhesion layer 118 and to be connected to the via contact 109, as shown in FIG. 10(b).

According to the third embodiment, the following effect is achieved in addition to the effects achieved by the first embodiment.

That is, copper is used as the material of the third metal film 117 composing the via contact 109 and the upper interconnect 119 and the via contact 109 is connected directly to the third metal film 117. Accordingly, even if electro migration occurs at continuity, the via contact 109 or the upper interconnect 119 is prevented from serving as a migration barrier which interrupts the movement of metal atoms. This prevents the breakage of the wiring due to an excessive or insufficient quantity of metal atoms adjacent the junction interface between the via contact 109 and the upper interconnect 119.

Although the third embodiment has used copper as the material of each of the via contact 109 and the third metal film 117, it is also possible to use another metal as the material of each of the via contact 109 and the third metal film 117.

Embodiment 4

A method of fabricating a semiconductor device according to a fourth embodiment of the present invention will be described with reference to the drawings.

FIGS. 11(a) to 11(c), FIGS. 12(a) to 12(c), FIGS. 13(a) to 13(c), and FIGS. 14(a) and 14(b) are cross-sectional views illustrating the individual process steps of the method of fabricating a semiconductor device according to the fourth embodiment.

Figure 11A:
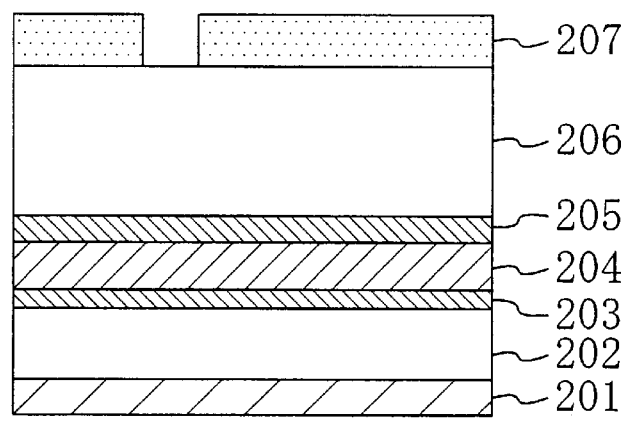
FIGS. 11(a) to 11(c) are cross-sectional views illustrating the individual process steps of a method of fabricating a semiconductor device according to a fourth embodiment.

First, as shown in FIG. 11(a), an insulating film 202 is deposited on a semiconductor substrate 201 that has been formed preliminarily with a semiconductor active element (not shown) Then, a first adhesion layer 203 composed of, e.g., a tantalum alloy film, a first metal film 204 composed of, e.g., a copper film, and a second adhesion layer 205 composed of, e.g., a tantalum alloy film are formed successively on the insulating film 202. Thereafter, a first interlayer insulating film 206 composed of, e.g., a silicon oxide film is deposited on the second adhesion layer 205.

The resulting multilayer thin film composed of the first adhesion layer 203, the first metal film 204, and the second adhesion layer 205 has a thickness of about 350nm and the first interlayer insulating film 206 has a thickness of about 1500 nm.

Figure 11B:
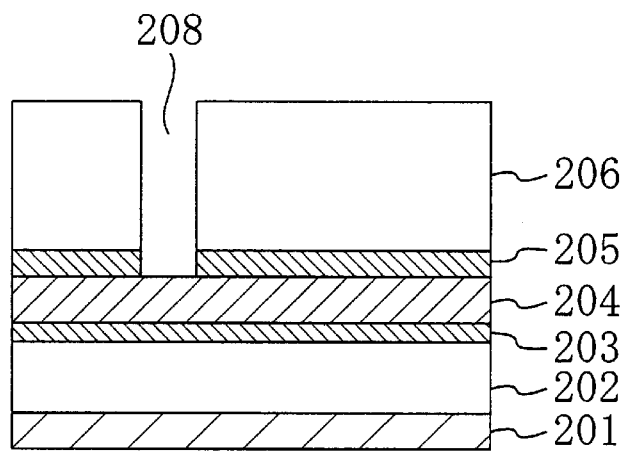

Next, a first resist pattern 207 having an opening over the via-hole formation region is formed on the first interlayer insulating film 206. Subsequently, dry etching is performed successively, with respect to the first interlayer insulating film 206 and the second adhesion layer 205 by using the first resist pattern 207 as a mask, thereby forming a via hole 208 in the second adhesion layer 205 and in the first interlayer insulating film 206, as shown in FIG. 11(b). After that, the first resist pattern 207 is removed by ashing.

Figure 11C:
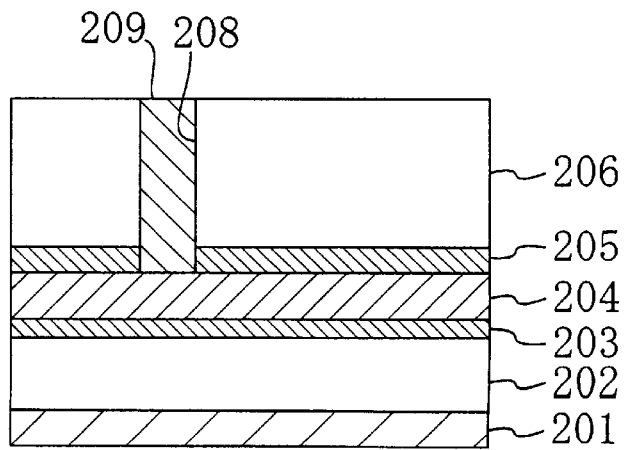

Next, as shown in FIG. 11(c), a second metal film, specifically a tungsten film, is grown selectively on a region of the first metal film 204 exposed in the via hole 208 by, e.g., electroplating, thereby forming a via contact 209 composed of the tungsten film. At this time, the first metal film 204 is used as the cathode for placing.

Figure 12A:
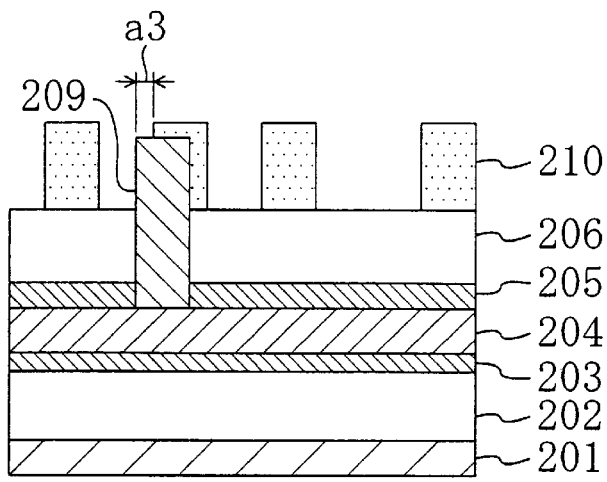
FIGS. 12(a) to 12(c) are cross-sectional views illustrating the individual process steps of the method of fabricating a semiconductor device according to the fourth embodiment.

Next, as shown in FIG. 12(a), the first interlayer insulating film 206 is etched back by a thickness of about 1000 nm to have a thickness of about 500 nm such that the via contact 209 protrudes from the top surface of the first interlayer insulating film 206. Then, a second resist pattern 210 is formed on the first interlayer insulating film 206 and the via contact 209 to mask the lower-interconnect formation region. It is to be noted that FIG. 12(a) shows the case where the second resist pattern 210 is displaced from the via contact 209 by the displacement size a3.

Figure 12B:
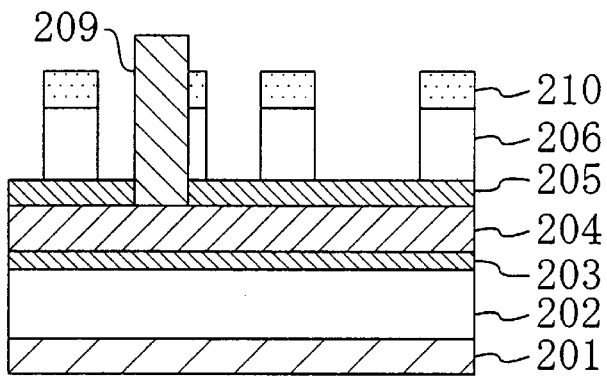

Next, as shown in FIG. 12(b), dry etching using a CF-containing etching gas for removing the oxide film is performed at a low temperature with respect to the first interlayer insulating film 206 by using the second resist pattern 210 and the via contact 209 as a mass, thereby patterning the first interlayer insulating film 206.

Figure 12C:
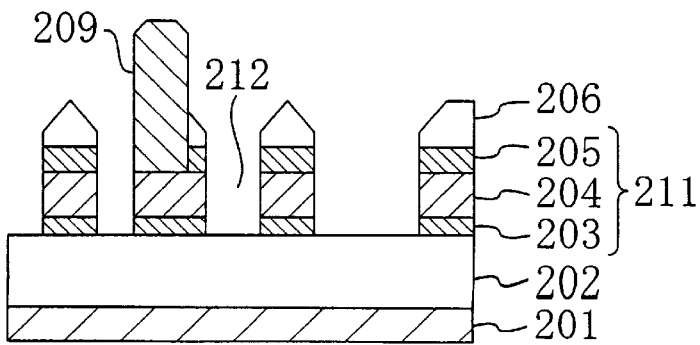

Next, as shown in FIG. 12(c), dry etching using a Cl-containing etching gas for removing the copper film and the tantalum-containing metal film is performed successively with respect to the second adhesion layer 205, the first metal film 204, and the first adhesion layer 203 by using the via contact 209 and the patterned first interlayer insulating film 206 as a mask, thereby forming a lower interconnect 211 composed of the first adhesion layer 203, the first metal film 204, and the second adhesion layer 205.

At this time, the via contact 209 serves as an etching stopper for dry etching using the CF-containing etching gas or the Cl-containing etching gas so that the lower interconnect 211 is formed reliably over the entire bottom surface of the via contact 209.

Between the adjacent lower interconnects 211 on the semiconductor substrate 201, there is formed an interconnect gap 212.

Figure 13A:
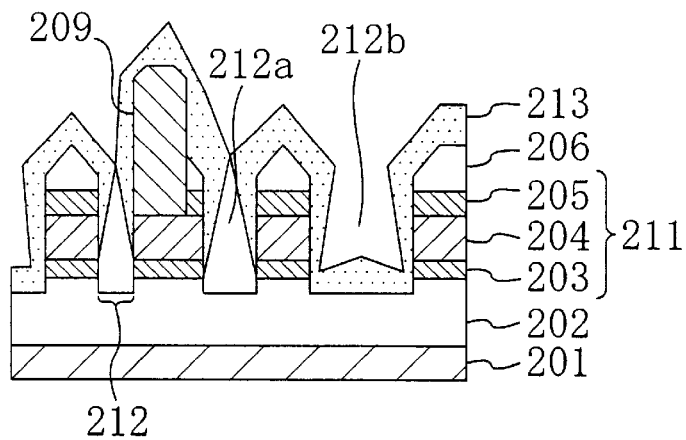
FIGS. 13(a) to 13(c) are cross-sectional views illustrating the individual process steps of the method of fabricating a semiconductor device according to the fourth embodiment.

Next, as shown in FIG. 13(a), dry etching using a CF-containing etching gas is performed with respect to the insulating film 202 by using the via contact 209 and the patterned first interlayer insulating film 206 as a mask, thereby partially removing the region disposed between the adjacent lower interconnect 211 and in the upper portion of the insulating film 202 by about a thickness of 300 nm. After that, a second interlayer insulating film 213 composed of a $SiO_2$ film is deposited on the insulating film 202, the first interlayer insulating film 206, the via contact 209, and the lower interconnect 211 by using a $SiH_4/N_2O$-containing gas plasma in, e.g., plasma CVD equipment.

Since the step coverage of the $SiO_2$ film deposited by using the $SiH_4/N_2O$-containing gas plasma is poor, if the groove formed in the interconnect gap 212 has a high aspect ratio, a void 212a is produced with in the interconnect gap 212 in the second interlayer insulating film 213. If the groove formed in the interconnect gap 212 has a low aspect ratio, a gap portion 212b is formed internally of the second interlayer insulating film 213 deposited over the wall surface and bottom portion of the groove.

In the present embodiment, it is preferable to remove, prior to the deposition of the second interlayer insulating film 213, a metal oxide film formed on the side surfaces of the first metal film 204 composing the lower interconnect 211 and the via contact 209 by performing plasma processing using a hydrogen plasma or an ammonia plasma with respect to the side surfaces of the first metal film 204 and the via contact 209 and then deposit an extremely thin film of SiN, SiON, or the like for preventing reoxidization, though they are not depicted in the drawings.

Figure 13B:
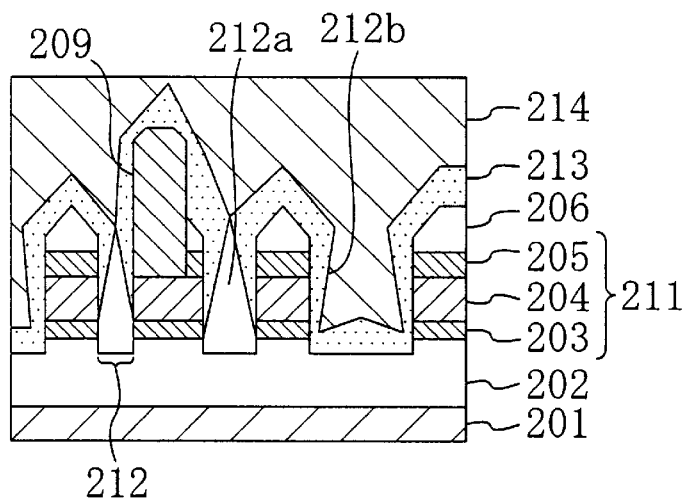

Next, as shown in FIG. 13(b), a third interlayer insulating film 214 composed of a $SiO_2$ film is deposited over the entire surface of the second interlayer insulating film 213 including the gap portion 212b by using, e.g., high-density plasma (EDP) CVD equipment.

Since the step coverage of the $SiO_2$ film deposited by using the high-density plasma is excellent, the gap portion 212b is filled completely with the third interlayer insulating film 214.

Since the second and third interlayer insulating films 213 and 214 have been deposited such that the void 212a is produced within the interconnect gap 212 as shown in FIGS. 13(a) and 13(b), the specific inductive capacity, i.e., capacitance between the adjacent lower interconnects 211 can be reduced.

Figure 13C:
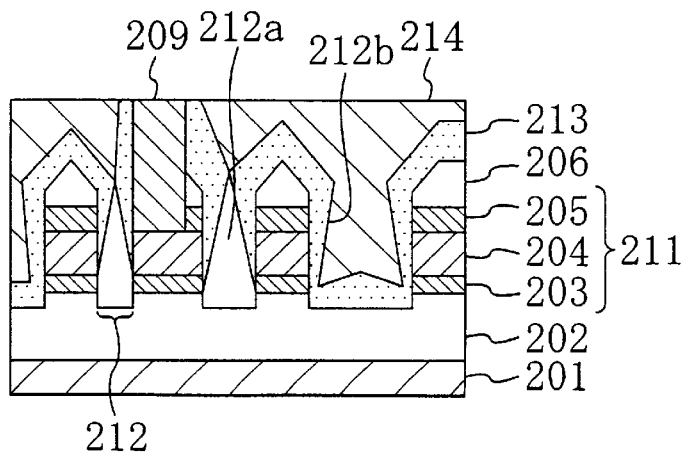

Next, as shown in FIG. 13(c), the third interlayer insulating film 214 is planarized by, e.g., CMP such that the via contact 209 is exposed.

At this time, since the top surface of the via contact 209 is higher in level than the upper end of the first interlayer insulating film 206, i.e., the upper end of the void 212a, it is possible to adjust the top surface of the planarized third interlayer insulating film 214 to be higher in level than the upper end of the void 212a by halting the polishing of the third interlayer insulating film 214 using CMP at the top surface of the via contact 209, i.e., by using the via contact 209 as an etching stopper. After the third interlayer insulating film 214 is planarized by CMP, the void 212a is prevented from forming an opening in the top surface of the planarized third interlayer insulating film 214.

Figure 14A:
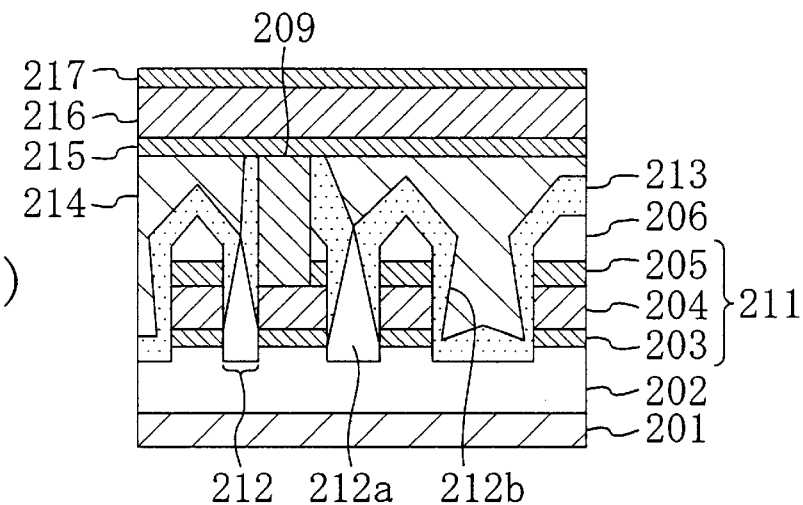
FIGS. 14(a) and 14(b) are cross-sectional views illustrating the individual process steps of the method of fabricating a semiconductor device according to the fourth embodiment.

Next, as shown in FIG. 14(a), a third adhesion layer 215 composed of, e.g., a tantalum alloy film, a third metal film 216 composed of, e.g., a cooper film, and a fourth adhesion layer 217 composed of, e.g., a tantalum alloy film are formed successively on the top surface of the third interlayer insulating film 214 including the top surface of the via contact 209.

Figure 14B:
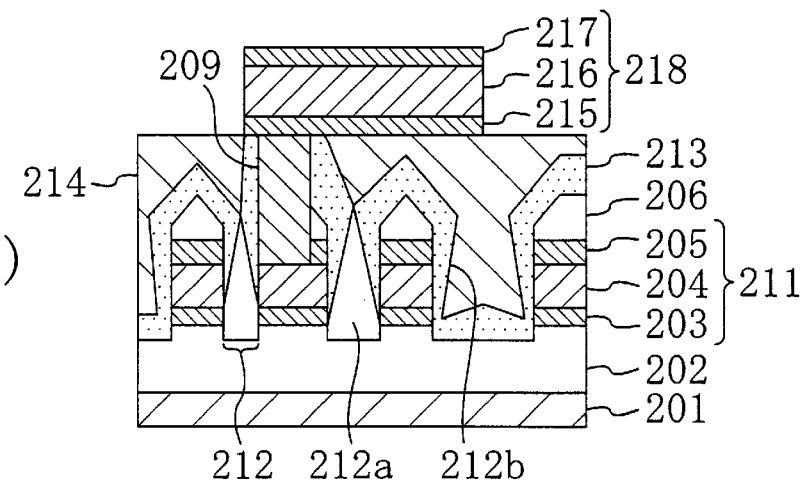

Next, a resist pattern (not shown) covering the upper-interconnect formation region is formed on the fourth adhesion layer 217. Then, dry etching is performed successively with respect to the fourth adhesion layer 217, the third metal film 216, and the third adhesion layer 215 by using the resist pattern as a mask, thereby forming the upper interconnect 218 which is composed of the third adhesion layer 215, the third metal film 216, and the fourth adhesion layer 217 and to be connected to the via contact 209, as shown in FIG. 14(b).

Thus, according to the fourth embodiment, the lower interconnect 211 is formed by forming the via contact 209 composed of the material different from the material of the first metal film 204 and patterning the first metal film 204 by using the mask pattern for forming the lower interconnect and the via contact 209 as a mask. Even when the mask pattern for forming the lower interconnect is displaced, the lower interconnect 211 is formed reliably over the entire bottom surface of the via contact 209, so that a reduction in the contact area between the lower interconnect 211 and the via contact 209 is prevented.

According to the fourth embodiment, it is also possible to grow the tungsten film only from the bottom side of the via hole 208 since the tungsten film is grown on the region of the first metal film 204 composing the lower interconnect 211 which is exposed in the via hole 208. This prevents the production of the void within the via hole 208 during the formation of the via contact 209 since the inner portion of the via hole 208 is filled with the tungsten film before the top portion thereof is clogged with the tungsten film.

In addition, the step of forming the cap layer can be omitted according to the fourth embodiment. Accordingly, the lower interconnect 211 can be formed easily compared with the case (see the first embodiment) where the cap layer composed of a material different from the material of the first metal film 204 is formed to cover the top surface of the via contact 209 and then the first metal film 204 is patterned to form the lower interconnect 211 by using the cap layer as a mask.

Moreover, since the fourth embodiment has interposed the first adhesion layer 203 and the second adhesion layer 205 between the first metal film 204 composing the lower interconnect 211 and the insulating film 202 and between the first metal film 204 and the first interlayer insulating film 206, respectively, the adhesion between the lower interconnect 211 and the insulating film 202 or the first interlayer insulating film 206 is improved.

Although the fourth embodiment has used copper and tungsten as the respective materials of the first metal film 204 and the via contact 209, a combination of other different metals may also be used as the respective materials of the first metal film 204 and the via contact 209 instead of copper and tungsten. Specifically, gold (Au), silver (Ag), nickel (Nii), platinum (Pt) niobium (Nb), paradium (Pd), or the like may be used as the material of the via contact 209 instead of tungsten if copper is used as the material of the first metal film 204.

Although the fourth embodiment has used electroplating in forming the via contact 209, electroless plating, selective CVD, or like method may also be used instead of electroplating.

Although the fourth embodiment has formed the first adhesion layer 203 under the first metal film 204 and the second adhesion layer 205 on the first metal film 204, the first or second adhesion layer 203 or 205 may not be formed.

In the fourth embodiment, plasma processing using an argon plasma or a hydrogen plasma may also be performed with respect to the portion of the first metal film 204 exposed in the via hole 208 between the step of forming the via hole 208 (see FIG. 10(b)) and the step of forming the via contact 209 (see FIG. 10(c)). The plasma processing removes the oxide layer formed on the surface of the portion of the first metal film 204 exposed in the via hole 208 and thereby accelerates the growth of the second metal film (metal film for forming the via contact 209) in the via hole 208.

In he fourth embodiment, the step of forming the via contact 209 (see FIG. 10(c)) may also be performed by growing the second metal film in the via hole 208 till the surface of the second metal film is higher in level than at least the surface of the first interlayer insulating film 206 and then removing the portion of the second metal film which is higher in level than the surface of the first interlayer insulating film 206, thereby forming the via contact 209. This ensures the formation of the via contact 209.

First Variation of Embodiment 4

A method of fabricating a semiconductor device according to a first variation of the fourth embodiment of the present invention will be described with reference to the drawings.

Figure 15A:
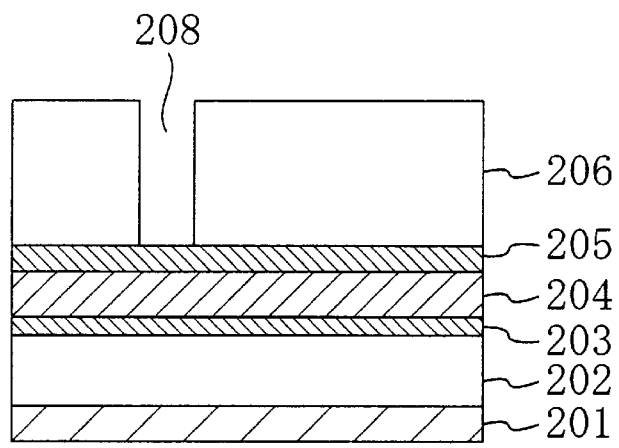
FIGS. 15(a) and 15(b) are cross-sectional views illustrating the individual process steps of the method of fabricating a semiconductor device according to a first variation of the fourth embodiment.
Figure 15B:
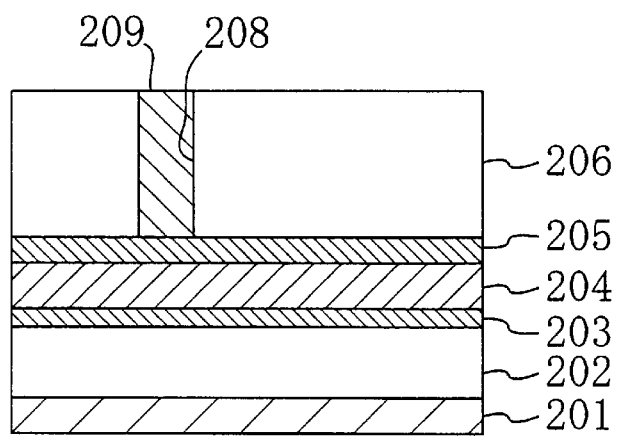
Figure 16:
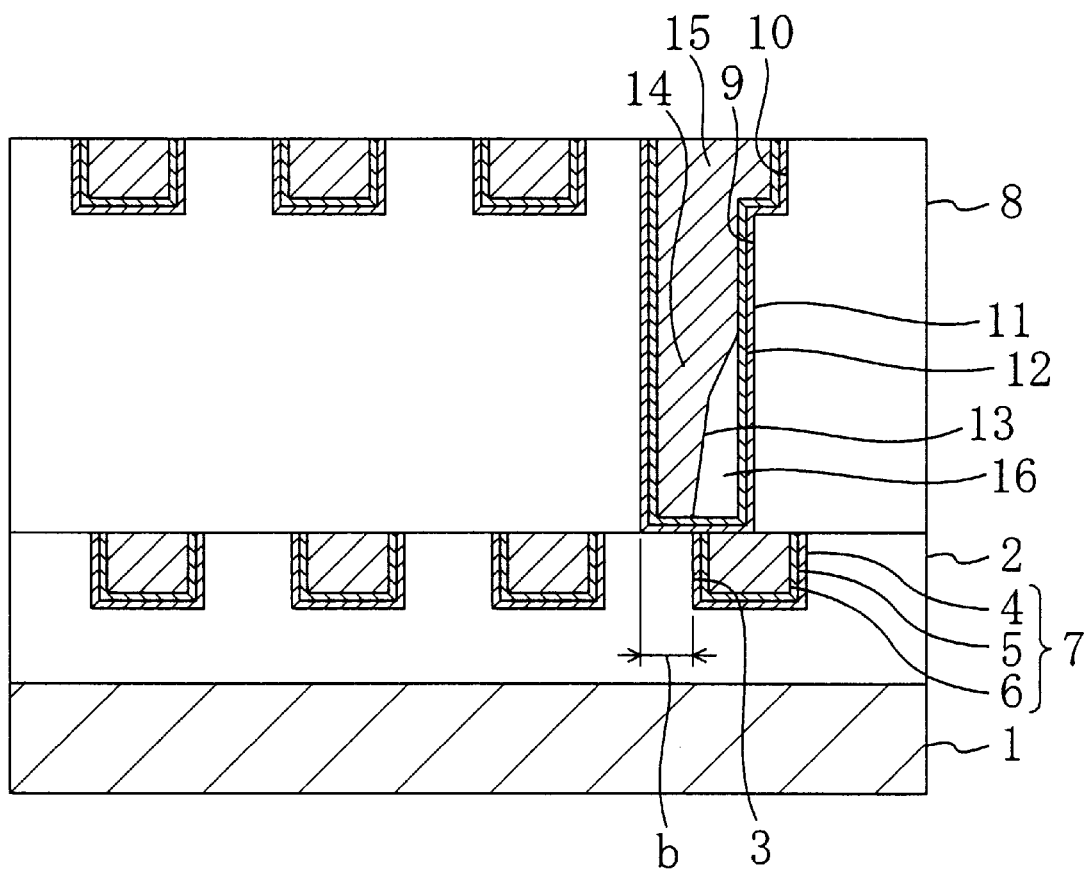
FIG. 16 is a cross-sectional view of a conventional semiconductor device.

FIGS. 15(a) and 15(b) are cross-sectional views illustrating the individual process steps of the method of fabricating a semiconductor device according to the first variation of the fourth embodiment.

The fabrication method of the first variation is different from that of the fourth embodiment in that the dry etching process using the first resist pattern 207 as a mask (see FIG. 11(a)) is performed only with respect to the first interlayer insulating film 206 to form the via hole 208 in the first interlayer insulating film 206, as shown in FIG. 15(a), and then the via contact 209 is formed on the region of the second adhesion layer 205 exposed in the via hole 208, as shown in FIG. 15(b).

The process steps subsequent to the step illustrated in FIG. 15(b) according to the first variation of the fourth embodiment are the same as the process steps subsequent to the step illustrated in FIG. 12(a) according to the fourth embodiment except that the second adhesion layer 205 is interposed between the first metal film 204 and the via contact 209.

Since the first variation of the fourth embodiment prevents the first metal film 204 composing the lower interconnect 211 from being exposed in the via hole 208 during the formation of the via contact 209, the oxidization of the first metal film 204 is suppressed so that the reliability of the lower interconnect 211 is improved.

Second Variation of Embodiment 4

A method of fabricating a semiconductor device according to a second variation of the fourth embodiment of the present invention will be described with reference to the drawings.

The fabrication method of the second variation is different from that of the fourth embodiment in that the step (see FIG. 11(c)) of forming the via contact 209 on the region of the first metal film 204 exposed in the via hole 208 is performed by exposing the top surface of the first metal film 204 to a gas containing silane at a high temperature of about 400° C., thereby forming the via contact 209 composed of a copper silicide layer.

Since the second variation of the fourth embodiment has formed the via contact 209 composed of the copper silicide layer by using the gas containing silane which selectively reacts with the first metal film 204, i.e., the copper film, the via contact 209 can be formed easily.

Although the second variation of the fourth embodiment has formed the via contact 209 composed of the copper silicide layer by using the gas containing silane, another reactive gas which selectively reacts with copper, such as TMAH (trimethylaluminum hydride), may also be used to form the via contact 209 composed of an AlCu film.

What is claimed is:

1. A method of fabricating a semiconductor device, the method comprising:

a first step of depositing a first metal film on an insulating film on a semiconductor substrate;

a second step of depositing a first interlayer insulating film on the first metal film;

a third step of forming, on the first interlayer insulating film, a first mask pattern having an opening over a region in which a via holes to be formed, etching the first interlayer insulating film by using the first mask pattern as a mask, and thereby forming a via hole in the first interlayer insulating film;

a fourth step of growing a second metal film in the via hole to form a via contact composed of the second metal film and forming a recessed portion over the via contact in the via hole;

a fifth step of forming, in the recessed portion, a cap layer composed of a material different from a material composing the first metal film;

a sixth step of forming, on the first interlayer insulating film, a second mask pattern covering a region in which a lower interconnect is to be formed, etching the first interlayer insulating film by using the second mask pattern and the cap layer as a mask, and thereby patterning the first interlayer insulating film;

a seventh step of etching the first metal film by using the cap layer and the patterned first interlayer insulating film as a mask and thereby forming a lower interconnect composed of the first metal film;

an eighth step of depositing a second interlayer insulating film over an entire surface of the semiconductor substrate;

a ninth step of planarizing the second interlayer insulating film and exposing the via contact or the cap layer; and a tenth step of forming, on the second interlayer insulating film, an upper interconnect to be connected to the via contact or the cap layer.

2. The method of claim 1, wherein the first metal film and the second metal film are composed of the same material.

3. The method of claim 2, wherein the first metal film and the second metal film are composed of copper.

4. The method of claim 2, wherein the first step includes the step of forming a first adhesion layer under the first metal film and forming a second adhesion layer on the first metal film, the third step includes the step of etching the first interlayer insulating film and the second adhesion layer by using the first mask pattern as a mask and thereby forming the via hole in the first interlayer insulating film and in the second adhesion layer, and the seventh step includes the step of etching the second adhesion layer, the first metal film, and the first adhesion layer by using the cap layer and the patterned first interlayer insulating film as a mask and thereby forming the lower interconnect composed of the first adhesion layer, the first metal film, and the second adhesion layer.

5. The method of claim 1, wherein the first step includes the step of forming a first adhesion layer under the first metal film and forming a second adhesion layer on the first metal film and the seventh step includes the step of etching the second adhesion layer, the first metal film, and the first adhesion layer by using the cap layer and the patterned first interlayer insulating film as a mask and thereby forming the lower interconnect composed of the first adhesion layer, the first metal film, and the second adhesion layer.

6. The method of claim 1, further comprising, between the third step and the fourth step, the step of performing plasma processing using an argon plasma or a hydrogen plasma with respect to a portion of the first metal film exposed in the via hole.

7. The method of claim 1, wherein the fourth step includes the step of forming the via contact and the recessed portion by growing the second metal film in the via hole such that an upper portion of the via hole remains hollow.

8. The method of claim 1, wherein the fourth step includes the step of forming the via contact and the recessed portion by growing the second metal film in the via hole such that the via hole is filled completely with the second metal film and then removing a portion of the second metal film formed in an upper portion of the via hole.

9. The method of claim 8, wherein the fourth step includes the step of removing the portion of the second metal film formed in the upper portion of the via hole by chemical mechanical polishing.

10. The method of claim 1, wherein the fourth step includes the step of growing the second metal film by electroplating.

11. The method of claim 10, wherein the fourth step includes the step of growing the second metal film by using the first metal film as a cathode for plating.

12. The method of claim 1, wherein the fourth step includes the step of growing the second metal film by electroless plating or CVD.

13. The method of claim 1, wherein the first metal film is composed of copper and the cap layer is composed of tungsten, gold, silver, nickel, niobium, or paradium.

14. The method of claim 1, wherein the fifth step includes the step of forming the cap layer by supplying, onto the semiconductor substrate, a reactive gas which selectively reacts with the second metal film.

15. The method of claim 14, wherein the second metal film is composed of copper and the reactive gas contains silicon.

16. The method of claim 1, wherein
the ninth step includes the step of leaving at least a lower portion of the cap layer and
the tenth step includes the step of forming the upper interconnect by performing patterning, while protecting a top surface of the via contact with the remaining cap layer.

17. The method of claim 1, wherein
the ninth step includes the step of etching back the second interlayer insulating film and the cap layer to remove the cap layer and cause an upper portion of the via contact to protrude from a top surface of the second interlayer insulating film and
the tenth step includes the step of forming a third adhesion layer over the second interlayer insulating film except for a top surface of the via contact, depositing successively a third metal film composed of the same material as composing the second metal film and a fourth adhesion layer on a top surface of the third adhesion layer including the top surface of the via contact, patterning the third adhesion layer, the third metal film, and the fourth adhesion layer, and thereby forming the upper interconnect composed of the third adhesion layer, the third metal film, and the fourth adhesion layer.

18. A method of fabricating a semiconductor device, comprising:
a first step of depositing a first metal film on an insulating film on a semiconductor substrate;
a second step of depositing a first interlayer insulating film on the first metal film;
a third step of forming, on the first interlayer insulating film, a first mask pattern having an opening over a region in which a via hole is to be formed, etching the first interlayer insulating film by using the first mask pattern as a mask, and thereby forming a via hole in the first interlayer insulating film;
a fourth step of growing a second metal film composed of a material different from a material composing the first metal film to form a via contact composed of the second metal film;
a fifth step of forming, on the first interlayer insulating film, a second mask pattern covering a region in which a lower interconnect is to be formed, etching the first interlayer insulating film by using the second mask pattern and the via contact as a mask, and thereby patterning the first interlayer insulating film;
a sixth step of etching the first metal film by using the via contact and the patterned first interlayer insulating film as a mask to form a lower interconnect composed of the first metal film;
a seventh step of depositing a second interlayer insulating film over the entire surface of the semiconductor substrate;
an eighth step of planarizing the second interlayer insulating film and exposing the via contact; and
a ninth step of forming, on the second interlayer insulating film, an upper interconnect to be connected to the via contact.

19. The method of claim 18, wherein the first metal film is composed of copper and the second metal film is composed of tungsten, gold, silver, nickel, niobium, or paradium.

20. The method of claim 18, wherein
the first step includes the step of forming a first adhesion layer under the first metal film and forming a second adhesion layer on the first metal film and
the seventh step includes the step of etching the second adhesion layer, the first metal film, and the first adhesion layer by using the cap layer and the patterned first interlayer insulating film as a mask and thereby forming the lower interconnect composed of the first adhesion layer, the first metal film, and the second adhesion layer.

21. The method of claim 18, further comprising, between the third step and the fourth step, the step of performing plasma processing using an argon plasma or a hydrogen plasma with respect to a portion of the first metal film exposed in the via hole.

22. The method of claim 18, wherein the fourth step includes the step of forming the via contact by growing the second metal film in the via hole till a surface of the second metal film becomes higher in level than a surface of the first interlayer insulating film and then removing a portion of the second metal film higher in level than the surface of the first interlayer insulating film.

23. The method of claim 18, wherein the fourth step includes the step of growing the second metal film by electroplating.

24. The method of claim 23, wherein the fourth step includes the step of growing the second metal film by using the first metal film as a cathode for plating.

25. The method of claim 18, wherein the fourth step includes the step of growing the second metal film by electroless plating or CVD.

26. The method of claim 18, wherein the fourth step includes the step of forming the second metal film by supplying, onto the semiconductor substrate, a reactive gas which selectively reacts with the first metal film.

27. The method of claim 26, wherein the first metal film is composed of copper and the reactive gas contains silicon.

* * * * *

UNITED STATES PATENT AND TRADEMARK OFFICE
CERTIFICATE OF CORRECTION

PATENT NO.    : 6,300,242 B1
DATED         : October 9, 2001
INVENTOR(S)   : Tetsuya Ueda et al.

It is certified that error appears in the above-identified patent and that said Letters Patent is hereby corrected as shown below:

<u>Title page,</u>
Item [75], Inventors, delete "Nobou Aoi" and insert -- Nobuo Aoi --

Signed and Sealed this

Thirtieth Day of April, 2002

*Attest:*

*Attesting Officer*

JAMES E. ROGAN
*Director of the United States Patent and Trademark Office*